· US010437118B2

(12) United States Patent
Jung et al.

(10) Patent No.: US 10,437,118 B2
(45) Date of Patent: Oct. 8, 2019

(54) LIQUID CRYSTAL DISPLAY DEVICE AND METHOD FOR MANUFACTURING THE SAME

(71) Applicant: LG Display Co., Ltd., Seoul (KR)

(72) Inventors: Young Ki Jung, Gyeonggi-do (KR); Jae Sung Yu, Seoul (KR); In Hyuk Song, Gyeonggi-do (KR); Jae Hoon Park, Gyeonggi-do (KR); Han Seok Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 93 days.

(21) Appl. No.: 15/647,215

(22) Filed: Jul. 11, 2017

(65) Prior Publication Data

US 2017/0363903 A1    Dec. 21, 2017

Related U.S. Application Data

(62) Division of application No. 13/627,589, filed on Sep. 26, 2012, now Pat. No. 9,720,295.

(30) Foreign Application Priority Data

Sep. 27, 2011   (KR) .................. 10-2011-0097759
Sep. 27, 2011   (KR) .................. 10-2011-0097760

(51) Int. Cl.
*G02F 1/1345*    (2006.01)
*G02F 1/1362*    (2006.01)
(Continued)

(52) U.S. Cl.
CPC ........ *G02F 1/13452* (2013.01); *G02F 1/1345* (2013.01); *G02F 1/13458* (2013.01);
(Continued)

(58) Field of Classification Search
CPC combination set(s) only.
See application file for complete search history.

(56) References Cited

U.S. PATENT DOCUMENTS 5,949,502 A * 9/1999 Matsunaga ....... G02F 1/136204
349/40
6,005,647 A * 12/1999 Lim .................. G02F 1/136204
349/139
(Continued)

FOREIGN PATENT DOCUMENTS

KR    20080080855 A    9/2008
KR    20090012131 A    2/2009
KR    20110072042 A    6/2011

*Primary Examiner* — Dung T Nguyen
(74) *Attorney, Agent, or Firm* — Morgan, Lewis & Bockius LLP

(57) ABSTRACT

Disclosed are an LCD device and a method of manufacturing the same, in which a passivation layer and a pixel electrode are simultaneously formed by a single mask process using a half tone mask, and thus, manufacturing efficiency increases, and a defective contact due to loss of the pixel electrode can be prevented in a pad area. The LCD device includes a pad part including a pad area and a contact area. The LCD device includes a pixel pad formed in the pad area, a pixel bar formed in the contact area, and a bridge layer contacting the pixel pad with the pixel bar. The bridge layer is formed as a single layer or multi layers, and formed of one or more of a transparent conductive material and an opaque conductive material.

15 Claims, 25 Drawing Sheets

(51) Int. Cl.
  *G06F 3/041*     (2006.01)
  *H01L 27/12*     (2006.01)
  *G02F 1/1333*    (2006.01)
  *G06F 3/044*     (2006.01)
  *H01L 21/768*    (2006.01)

(52) U.S. Cl.
  CPC .............. *G02F 1/136227* (2013.01); *G02F 2001/13629* (2013.01); *G02F 2001/133357* (2013.01); *G02F 2001/136231* (2013.01); *G02F 2001/136236* (2013.01); *G06F 3/044* (2013.01); *G06F 3/0412* (2013.01); *G06F 2203/04103* (2013.01); *H01L 21/76802* (2013.01); *H01L 27/1244* (2013.01); *H01L 27/1288* (2013.01)

(56) References Cited

U.S. PATENT DOCUMENTS

| | | | |
|---|---|---|---|
| 6,128,051 | A | 10/2000 | Kim et al. |
| 7,538,399 | B2 | 5/2009 | Kim et al. |
| 7,692,443 | B2 | 4/2010 | Jeon |
| 7,952,671 | B2 | 5/2011 | Aota et al. |
| 8,603,914 | B2 | 12/2013 | Song |
| 8,792,060 | B2 | 7/2014 | Oh et al. |
| 9,720,295 | B2 * | 8/2017 | Jung .................... G02F 1/1345 |
| 2008/0213472 | A1 | 9/2008 | Song |
| 2008/0316416 | A1 | 12/2008 | Chang et al. |
| 2009/0027579 | A1 | 1/2009 | Aota et al. |

* cited by examiner

FIG. 6
Prior Art

| Mask | Layer |
| --- | --- |
| 1 | Light shield |
| 2 | Active |
| 3 | Gate |
| 4 | LDD & source / drain |
| 5 | ILD / contact hole 1 |
| 6 | data contact |
| 7 | PAS1 |
| 8 | common electrode(Vcom) |
| 9 | conductive line |
| 10 | PAS2 / contact hole 2 |
| 11 | pixel electrode |

FIG. 12
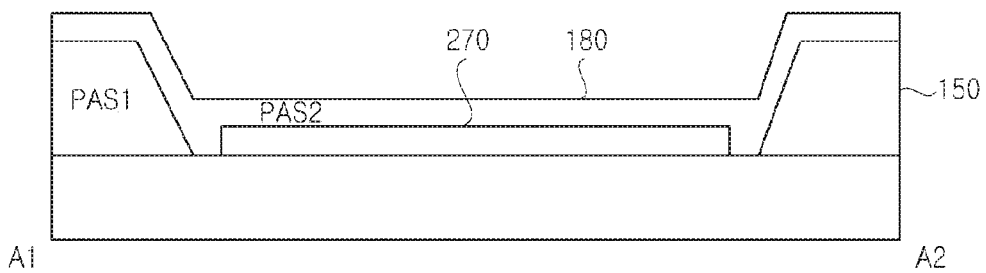
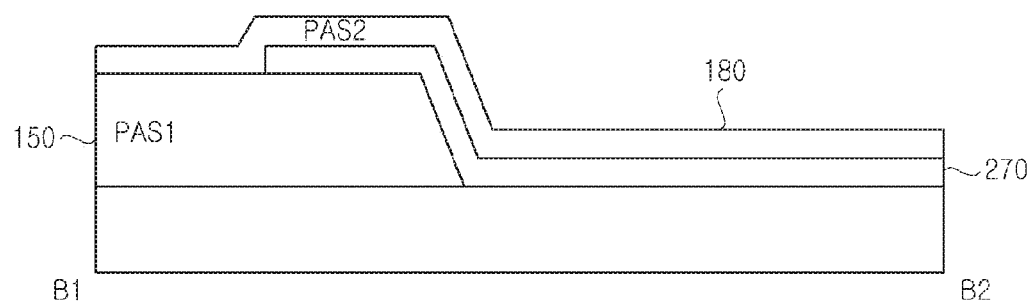

FIG. 15
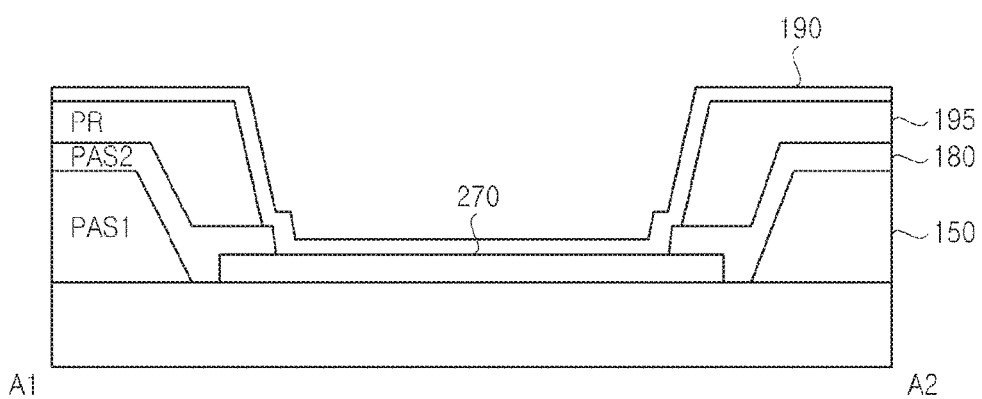
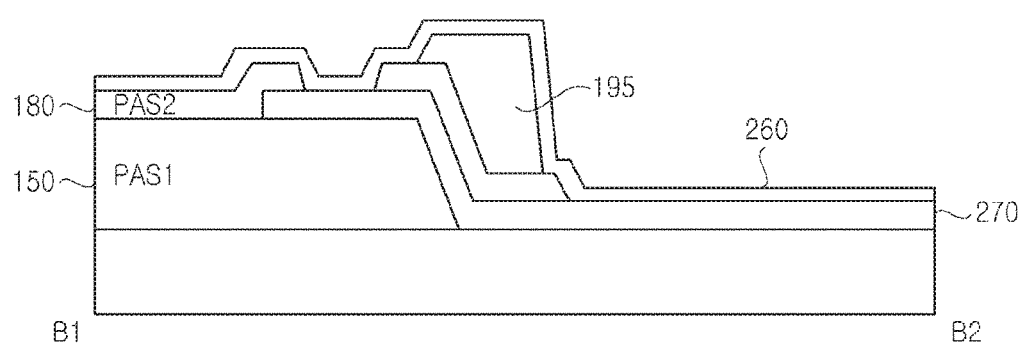

FIG. 20
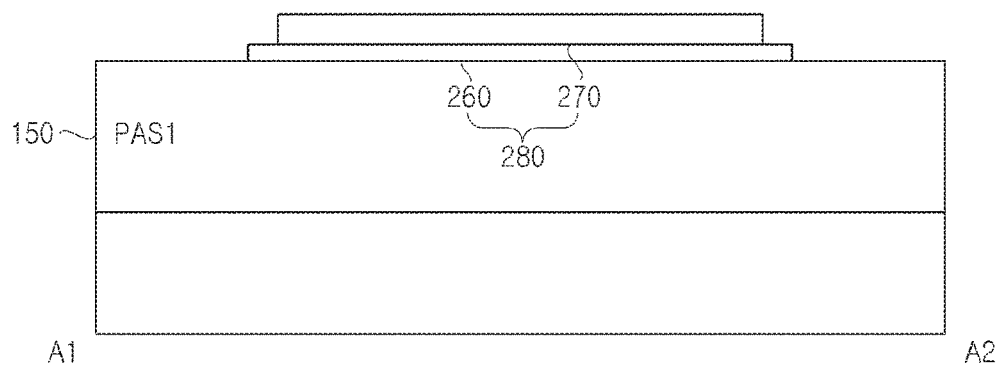
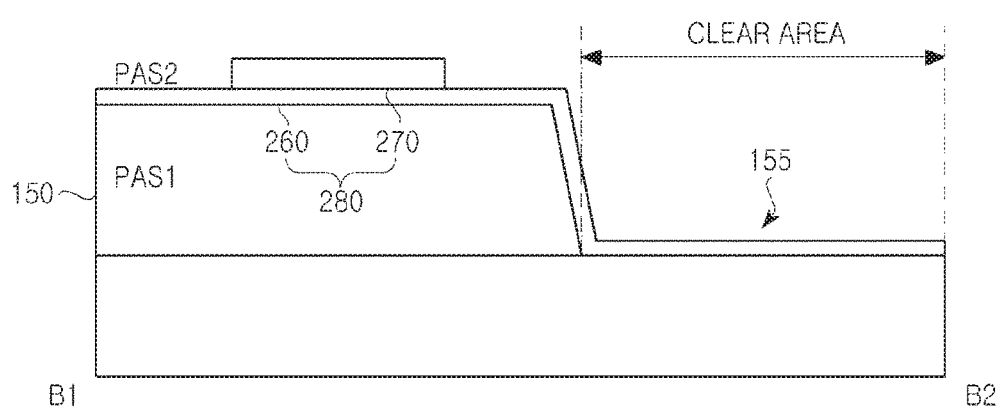

FIG. 21
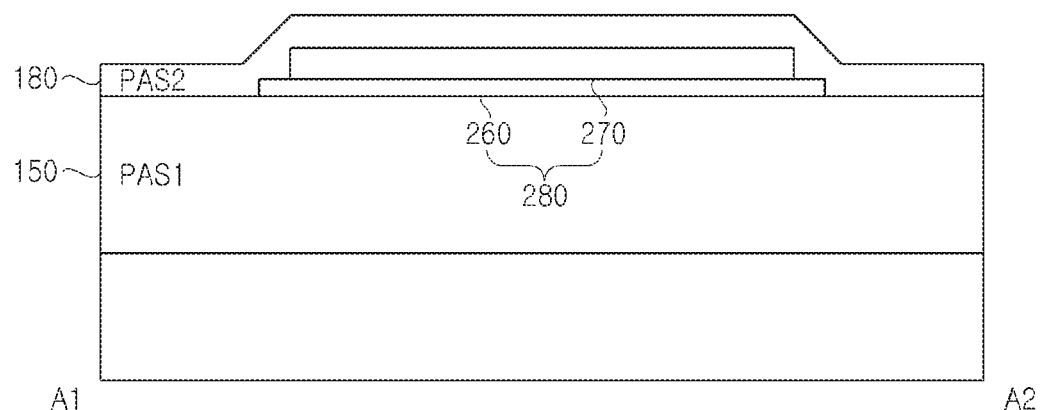
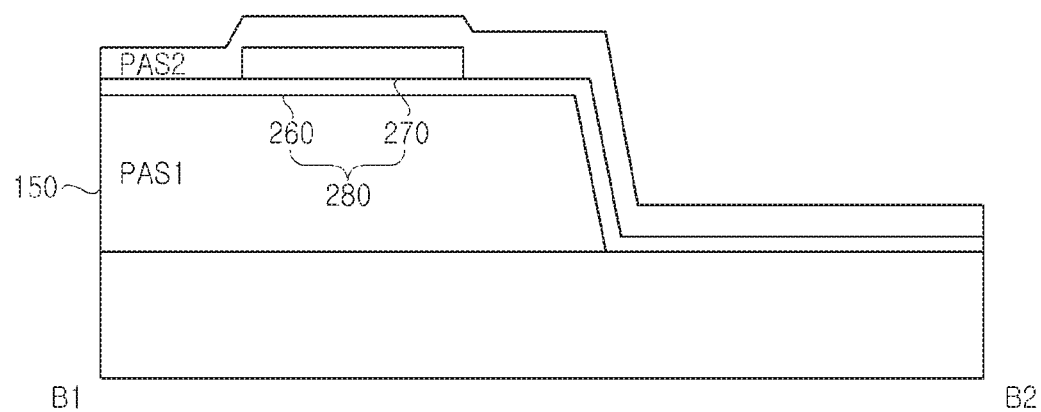

FIG. 22
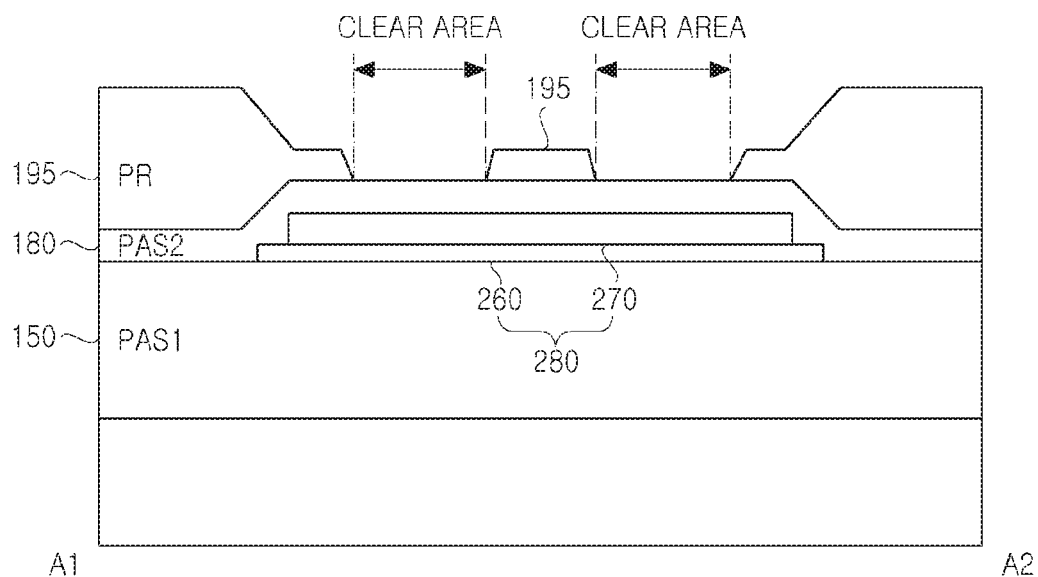
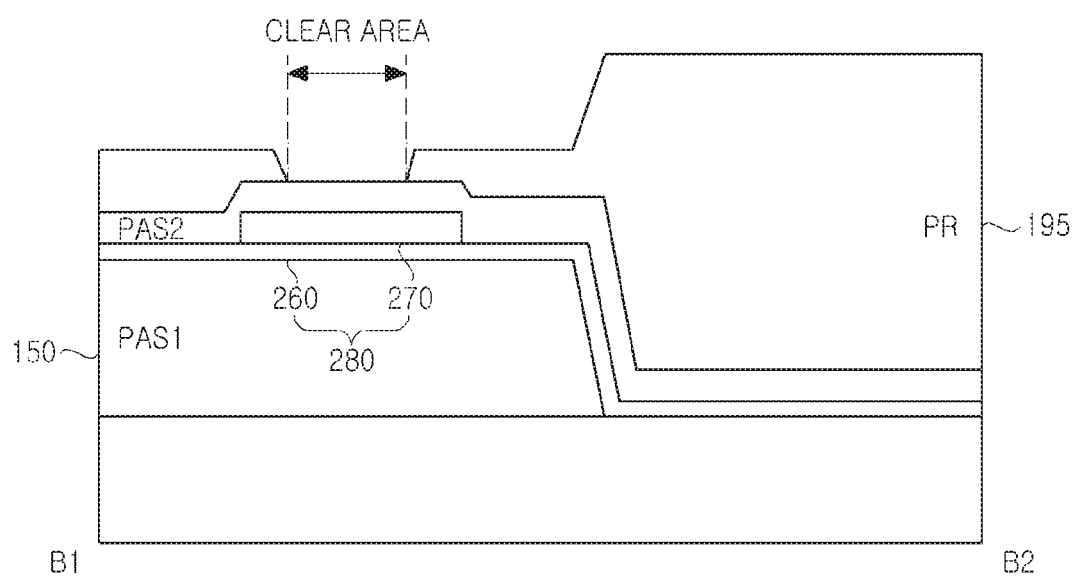

FIG. 23
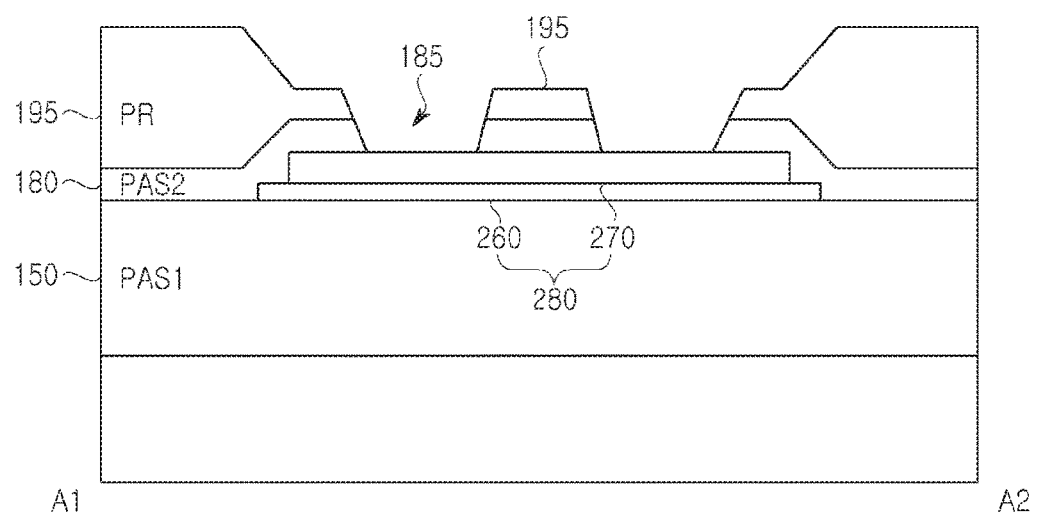
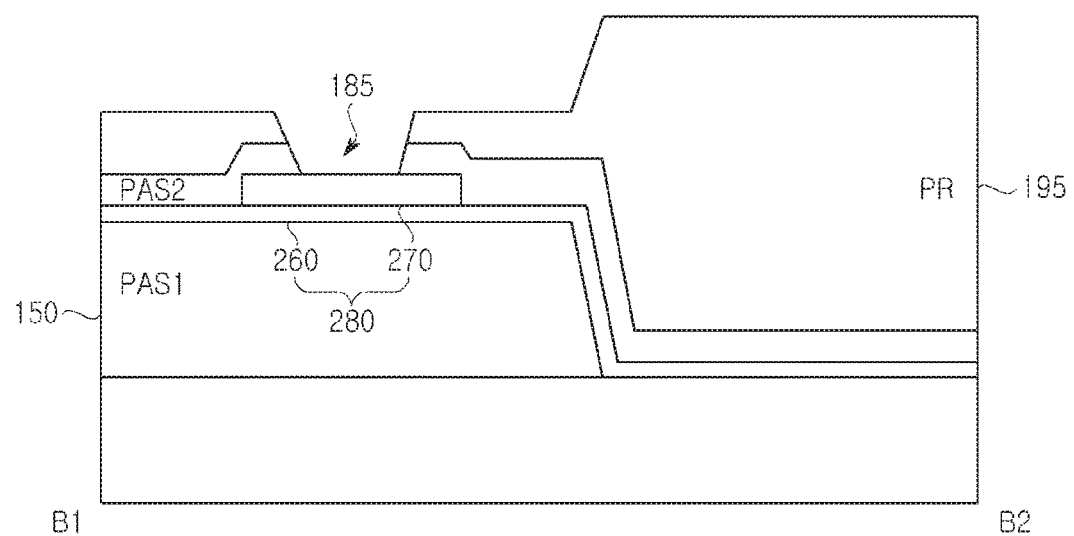

| Mask | Layer |
|---|---|
| 1 | Light shield |
| 2 | Active |
| 3 | Gate |
| 4 | LDD & source / drain |
| 5 | ILD / contact hole 1 |
| 6 | data contact |
| 7 | PAS1 |
| 8 | common electrode(Vcom) |
| 9 | conductive line |
| 10 | PAS2 / contact hole 2 / pixel electrode |

(B)

| Mask | Layer |
|---|---|
| 1 | Light shield |
| 2 | Active |
| 3 | Gate |
| 4 | LDD & source / drain |
| 5 | ILD / contact hole 1 |
| 6 | data contact |
| 7 | PAS1 |
| 8 | common electrode(Vcom) / conductive line |
| 9 | PAS2 / contact hole 2 / pixel electrode |

LIQUID CRYSTAL DISPLAY DEVICE AND METHOD FOR MANUFACTURING THE SAME

CROSS-REFERENCE TO RELATED APPLICATIONS

This is divisional application of U.S. patent application Ser. No. 13/627,589 filed on Sep. 26, 2012, which claims the priority benefit of the Korean Patent Application No. 10-2011-0097759 filed on Sep. 27, 2011, and of Korean Patent Application No. 10-2011-0097760 filed on Sep. 27, 2011. All of the above prior U.S. and Korean patent applications are hereby incorporated by reference as if fully set forth herein.

BACKGROUND

Field of the Invention

The present invention relates to a liquid crystal display (LCD) device, and more particularly, to an LCD device and a method of manufacturing the same, in which a passivation layer and a pixel electrode are simultaneously formed by a single mask process using a half tone mask, and thus, manufacturing efficiency increases, and a defective contact due to loss of the pixel electrode can be prevented in a pad area.

Discussion of the Related Art

Recently, in applying a touch sensor (screen) to LCD devices, a liquid crystal panel with integrated touch sensor is developed for slimming. Particularly, an in-cell touch type LCD device that uses a common electrode (which is formed on a lower substrate) as a touch sensing electrode is developed.

FIG. 1 is a view illustrating a related art LCD device. FIG. 2 is a view illustrating a pixel structure of the related art LCD device.

In FIGS. 1 and 2, the structure of a thin film transistor (TFT) array substrate (lower substrate) is illustrated in the fringe field switch (FFS) mode, and it is illustrated that a touch sensor is built in the TFT array substrate in an in-cell touch type.

In FIGS. 1 and 2, a color filter array substrate (upper substrate), a liquid crystal layer, and a driving circuit part for driving a liquid crystal panel are not illustrated.

An active area 1 for displaying an image is formed at the TFT array substrate, and a plurality of pad parts 3 to 5 are formed in an inactive area formed at an outer portion.

A plurality of pixels are formed in the active area 1.

The pad part 3 is a unit on-off pad part, the pad part 4 is a unit FPC pad/unit FPC shorting connection part, and the pad part 5 is a bump input dummy/bump output dummy part.

In FIG. 1, the pad part is illustrated as being formed at an outer portion of an upper end of the panel, but may be formed at an outer portion of each of a left side, right side, and lower end of the panel.

The pixels formed in the active area are defined by intersection between a plurality of data lines (not shown) and gate lines (not shown), respectively. A TFT is formed in each of a plurality of areas defined by intersection between the data lines and the gate lines.

Referring to FIG. 2, each pixel of the related art LCD device includes a TFT, a common electrode 60, and a pixel electrode 90 that are formed on a glass substrate 10.

Specifically, each pixel includes a light shield 20, a buffer layer 22, a TFT, a gate insulator (GI) 36, an inter-layer dielectric (ILD) 40, a plurality of passivation layers (PAS1 and PAS2) 50 and 80, a data contact 45, a common electrode 60, a touch sensing line 70, and a pixel electrode 90.

The TFT is configured with an active 30, a source 32, and a drain 34 that are formed under the gate insulator 36, and a gate 38 formed on the gate insulator 36.

The touch sensing line 70 is formed on the common electrode 60 to cross the pixels, and connects the common electrodes 60 of the respective pixels.

Here, the common electrode 60 supplies a common voltage (Vcom) to a corresponding pixel during a display period, and performs the function of a touch sensing electrode for detecting a touch during a non-display period.

Each pixel having the above-described structure is formed by a manufacturing method illustrated in FIG. 3.

FIG. 3 is a view for describing limitations of a related art method of manufacturing an LCD device. In FIG. 3, a view of a manufacturing method for forming a plurality of layers formed under the inter-layer dielectric 40 is not illustrated.

Referring to FIG. 3, a first passivation layer (PAS1) 50 is formed of photo acryl, on the inter-layer dielectric 40. A first contact hole 55 is formed by etching an area that overlaps the data contact 45. Here, the first passivation layer 50 is formed to a thickness of 3 um, and a top of the data contact 45 is exposed by the first contact hole 55.

Subsequently, the common electrode 60 is formed of a transparent conductive material such as indium tin oxide (ITO) or indium tin zinc oxide (ITZO), in a pixel area in a top of the first passivation layer 50.

Subsequently, the touch sensing line 70 is formed on the common electrode 60, and connects the common electrodes 60 of adjacent pixels.

Subsequently, a second passivation layer (PAS2) 80 is formed on the first passivation layer 50 to cover the common electrode 60 and the touch sensing line 70.

Subsequently, the second passivation layer (PAS2) 80 is etched to expose a top of the data contact 45 by performing an etching process and a photolithography process using a half tone mask, thereby forming a second contact hole 85.

Herewith, a photoresist (PR) 95 is coated on the second passivation layer 80, and a pixel electrode layer is formed of ITO, indium zinc oxide (IZO), or ITZO on the photoresist 95 for forming a pixel electrode.

Subsequently, the pixel electrode layer is patterned, the photoresist 95 is ashed, and then a pixel electrode 90 is formed in a finger shape by performing a lift-off process.

In this case, the pixel electrode 90 is formed in a finger shape on the second passivation layer 80 by using a half tone area of the half tone mask. Furthermore, the second passivation layer 80 in an area overlapping the data contact 45 is etched using a full tone area of the half tone mask. By forming the pixel electrode 90 in a second contact hole 85, the data contact 45 contacts the pixel electrode 90.

In the related art LCD device manufactured by the above-described manufacturing method, the first passivation layer 50 is thickly formed to a thickness of 3 um, and the photoresist 95 is coated to a thickness of 2 um to 3 um.

In coating the photoresist 95, due to planarization characteristic, the thickness of the photoresist 95 formed in a portion corresponding to the full tone area is thickened to 5 um to 6 um. In this case, in a manufacturing process, the photoresist 95 coated for forming the pixel electrode 90 may not all be removed through an ashing process but may be partially left in a contact hole.

Specifically, by adding the thickness (3 um) of the first passivation layer 50 to a target thickness (0.5 um to 1.0 um) of the half tone area, the photoresist 95 is partially left to a thickness of 3.5 um to 5.5 um in a side wall portion of the contact hole.

With the photoresist 95 being partially left, by performing the lift-off process, the photoresist 95 is stripped in the contact hole, causing the loss of the pixel electrode 90.

The photoresist 95 is ashed, and then, by performing the lift-off process, the photoresist 95 that is left in the contact hole is removed, and simultaneously the pixel electrode 90 formed in the contact hole is removed together with the photoresist 95.

FIG. 4 is a view for describing disconnection of a pixel bar that occurs in a pad part of the related art LCD device. In FIG. 4, the unit on-off pad part 3 among the pad parts 3 to 5 is illustrated.

Referring to FIG. 4, the unit on-off pad part 3 among the pad parts 3 to 5 includes a plurality of pads 12 and pixel bars 14.

The unit on-off pad part 3 formed in an outer portion of the panel is formed by a manufacturing process of forming a pixel, in which case the first contact hole 55 is formed by broadly etching the first passivation layer 50 to a size of 250 μm. The unit on-off pad part 3 has a structure in which a pixel pad and the second contact hole 85 of the second passivation layer 80 are arranged in the first contact hole 55.

Connection of the pixel bar 14 is made using the first contact hole 55 portion, and thus, the plurality of pixel pads 12 and the second contact hole 85 are arranged in plurality, in the first contact hole 55.

In a manufacturing process, a pixel area with no second contact hole 85 is formed using the half tone area, and thus, the pixel electrode 90 formed on the second passivation layer 80 is lost in a pad area identically to the pixel area.

In this case, the pixel electrode 90 formed in the pad area cannot act as an electrode receiving a data voltage, unlike a pixel electrode formed in the pixel area, and acts as a contact that connects the pixel bar 14 to the pixel pad 12.

In this way, if the pixel electrode 90 is lost in the pad area, respective signals cannot be supplied to a plurality of pixels formed in the active area, and thus, the test of a manufactured panel is not smoothly performed, and moreover defective driving occurs in which an image cannot normally be displayed.

FIG. 5 is a view for describing disconnection of a pixel bar that occurs in a pad part of the related art LCD device. In FIG. 5, the unit FPC pad part/unit FPC shorting connection part 4 among the pad parts 3 to 5 is illustrated.

Referring to FIG. 5, the unit FPC pad part/unit FPC shorting connection part 4 among the pad parts 3 to 5 includes a plurality of pads 12, pixel bars 14, and power lines 16.

The unit FPC pad part/unit FPC shorting connection part 4 formed in an outer portion of the panel is formed by a manufacturing process of forming a pixel in the active area.

In a manufacturing process, the first contact hole 55 is formed by broadly etching the first passivation layer (PAS1) 50. A plurality of pixel pads are arranged in the first contact hole 55, and the pad 12 is connected to the pixel bar 14.

A data voltage is supplied to a pixel electrode in a pixel area, but the pixel electrode 90 formed in a pad area is formed for performing the function of a contact, without receiving a data voltage. That is, the pixel electrode 90 formed in the pad area acts as a contact that connects the pixel bar 14 to the pixel pad 12.

In a manufacturing process, a pixel area with no second contact hole 85 is formed using the half tone area of a mask. Therefore, the pixel electrode 90 formed on the second passivation layer 80 is lost in the pad area, similarly to the pixel area.

In this way, if the pixel electrode 90 is lost in the pad area, respective signals cannot be supplied to a plurality of pixels formed in the active area. For this reason, the test of a manufactured panel cannot smoothly be performed. Also, defective driving occurs in which an image cannot normally be displayed.

In a method that prevents the defective contact of the pixel bar 14 due to the loss of the pixel electrode 90, there is a method that connects the pad 12 and the pixel bar 14 by using the metal of the touch sensing line 70 in a manufacturing process.

However, the test of the panel is completed, and then a line between the pad 12 and the pixel bar 14 is cut along a scribe line. Therefore, metal that connects the pad 12 and the pixel bar 14 is exposed to the outside.

FIG. 6 is a view illustrating a plurality of masks that are used in a schematic manufacturing method and process of a related art LCD device with integrated touch sensor.

Referring to FIG. 6, a total of eleven masks are used in manufacturing a TFT array substrate with integrated touch sensor, for which a plurality of detailed processes are performed. For example, a plurality of processes of respectively forming a light shield with a mask 1, forming an active with a mask 2, forming a gate with a mask 3, forming a lightly doped drain (LDD) with a mask 4, forming an inter-layer dielectric (ILD) with a mask 5, forming a data contact with a mask 6, forming a first passivation layer (PAS1) with a mask 7, forming a common electrode with a mask 8, forming a conductive line with a mask 9, forming a second passivation layer (PAS2) with a mask 10, and forming a pixel electrode (PXL) with a mask 11 are sequentially performed.

Especially, different masks are used in forming the common electrode and the touch sensing line, and different masks are used in forming the second passivation layer (PAS2) and the pixel electrode (PXL). In this way, in manufacturing the related art LCD device with integrated touch sensor, a number of masks are used, and thus, the manufacturing cost increases.

Moreover, since a detailed process is performed in each mask process, the manufacturing cost is high, and a time taken in manufacturing is long, causing the decrease in product competitiveness.

SUMMARY

Accordingly, the present invention is directed to an LCD device and a method of manufacturing the same that substantially obviate one or more problems due to limitations and disadvantages of the related art.

An aspect of the present invention is directed to provide an LCD device and a method of manufacturing the same, which a passivation layer and a pixel electrode are simultaneously formed by a single mask process using a half tone mask, and thus, manufacturing efficiency increases.

Another aspect of the present invention is directed to provide an LCD device and a method of manufacturing the same, which can prevent disconnection, caused by loss of a pixel electrode due to a lift-off process, in a pad area.

Another aspect of the present invention is directed to provide an LCD device and a method of manufacturing the same, which can the contact performance of a pixel bar in a pad area.

In addition to the aforesaid objects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an LCD device, in which a pad part including a pad area and a contact area is formed, including: a pixel pad formed in the pad area; a pixel bar formed in the contact area; and a bridge layer contacting the pixel pad with the pixel bar, wherein, the bridge layer is formed as a single layer or multi layers, and the bridge layer is formed of one or more of a transparent conductive material and an opaque conductive material.

In another aspect of the present invention, there is provided a method of manufacturing an LCD device, which includes a pad area with a pixel pad formed therein and a contact area with a pixel bar formed therein, including: forming a first passivation layer in the pad area and the contact area, and removing a portion of the first passivation layer to form a first contact hole; forming a lower metal inside the first contact hole in the pad area, inside the first contact hole in the contact area, and on the first passivation layer in the contact area; forming a second passivation layer to cover the first passivation layer and the lower metal; removing a portion of the second passivation layer overlapping the lower metal in the pad area and removing another portion of the second passivation layer overlapping the pixel bar in the contact area to form a second contact hole; and coating a transparent conductive material on the pad area to form a pixel electrode, and coating a transparent conductive material on the contact area to form a contact pattern, wherein the pixel pad and the pixel bar are connected with the contact pattern and the lower metal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 6 is a view illustrating a plurality of masks that are used in a schematic manufacturing method and process of a related art LCD device with integrated touch sensor;

FIGS. 11 to 15 are views illustrating a method of manufacturing an LCD device according to an embodiment of the present invention;

FIGS. 20 to 24 are views illustrating a method of manufacturing an LCD device according to an embodiment of the present invention; and FIG. 25 is a view illustrating a plurality of masks that are used in a schematic manufacturing method and process of an LCD device with integrated touch sensor.

DETAILED DESCRIPTION OF THE INVENTION

Figure 1:
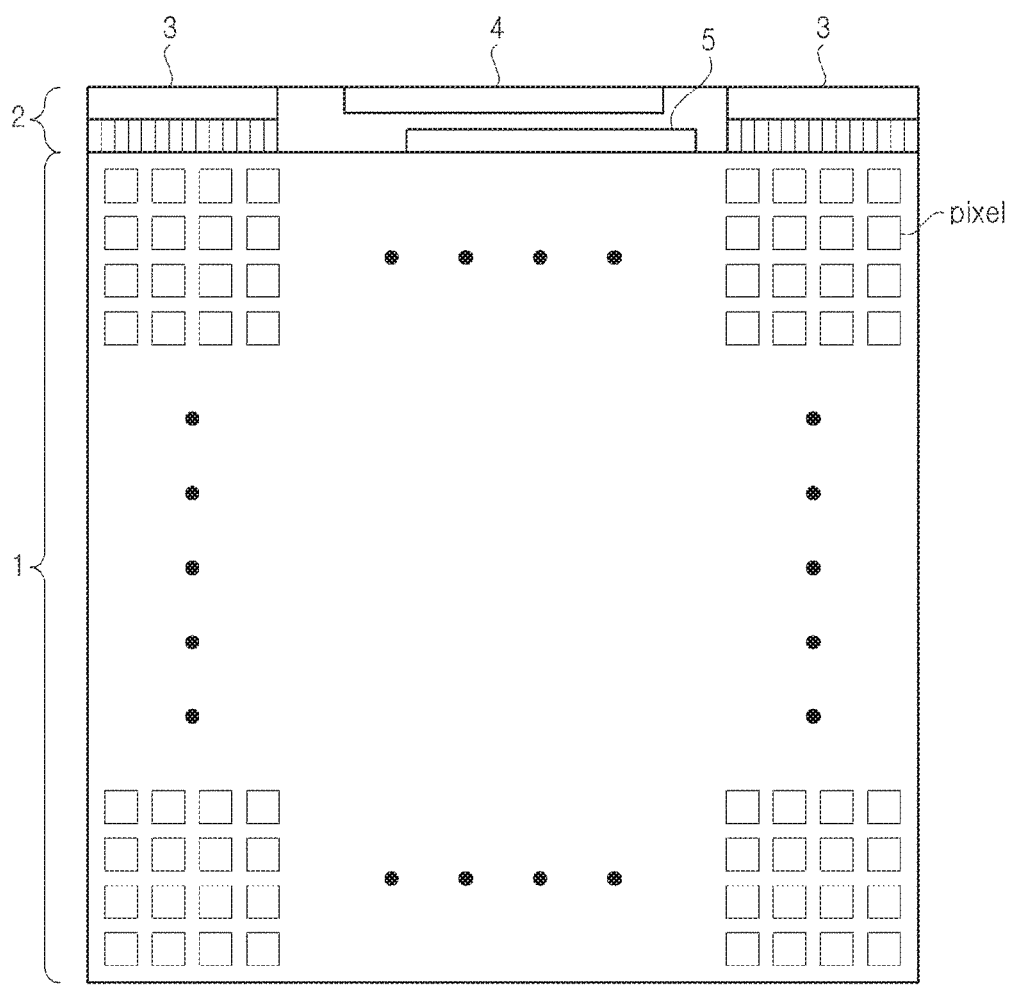
FIG. 1 is a view illustrating a related art LCD device.
Figure 2:
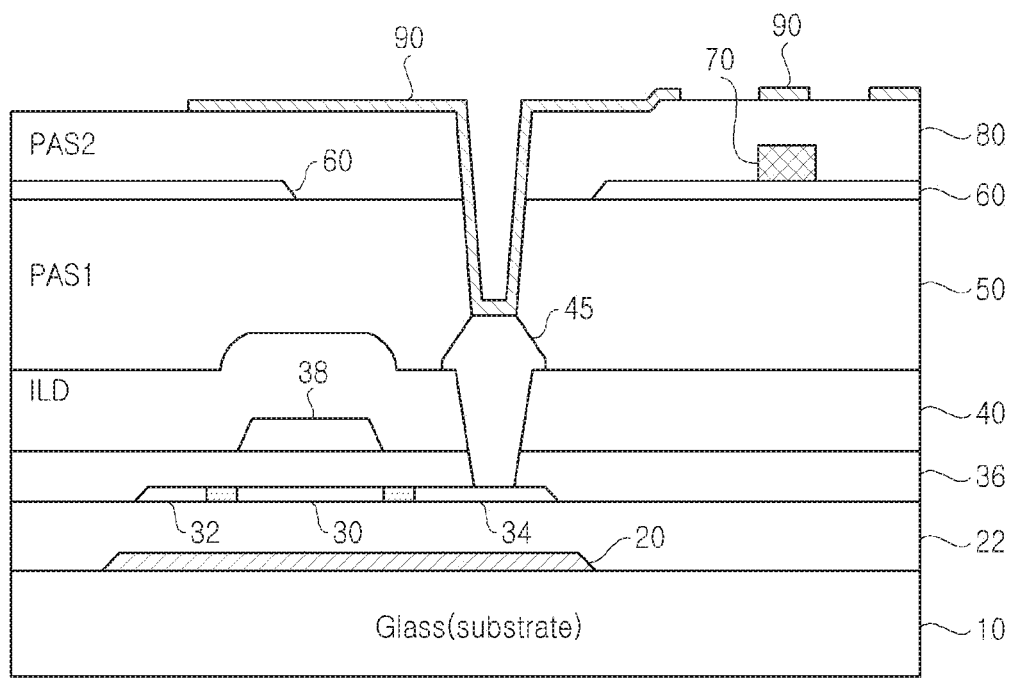
FIG. 2 is a view illustrating a pixel structure of the related art LCD device.
Figure 3:
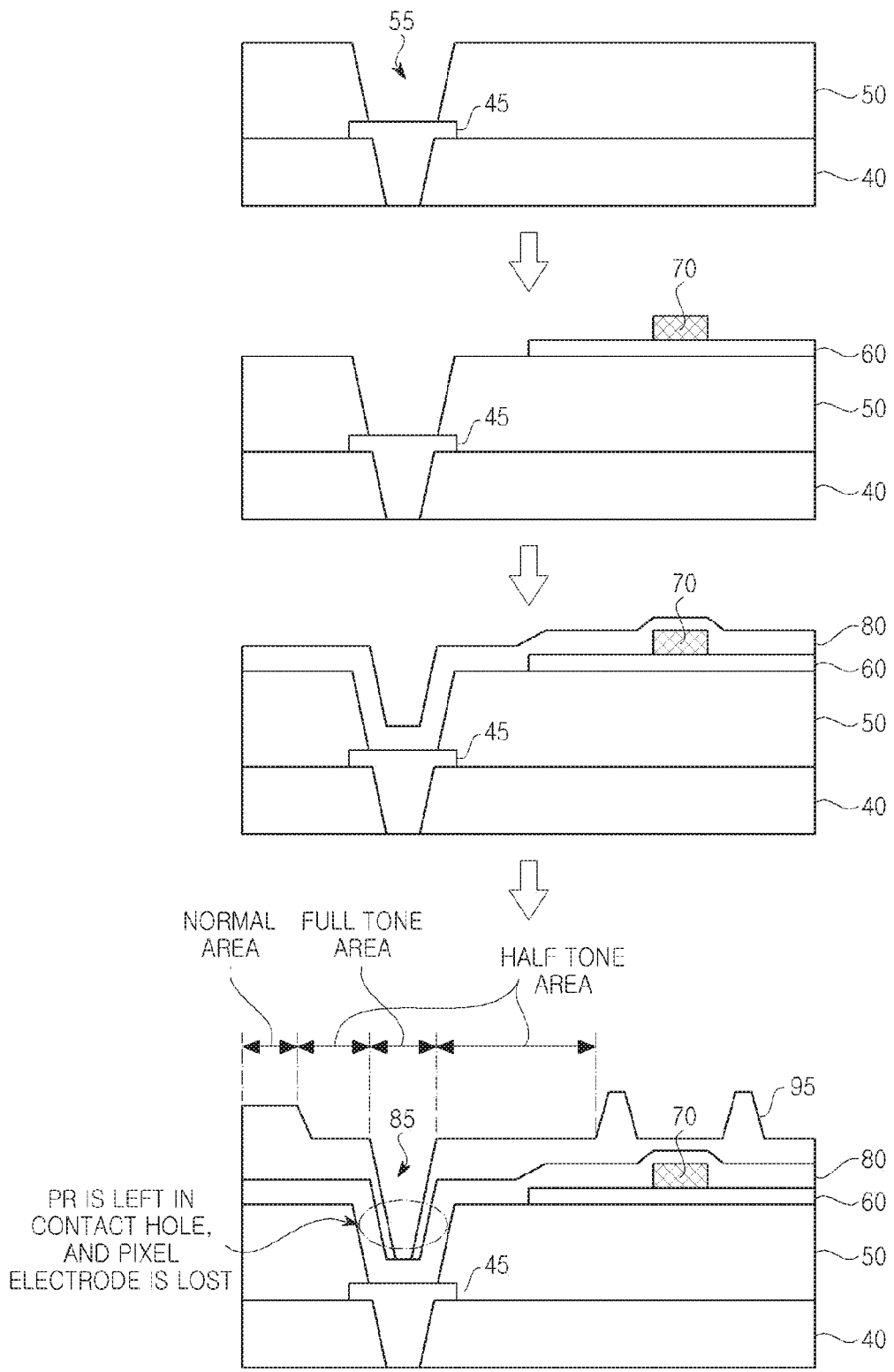
FIG. 3 is a view for describing limitations of a related art method of manufacturing an LCD device.
Figure 4:
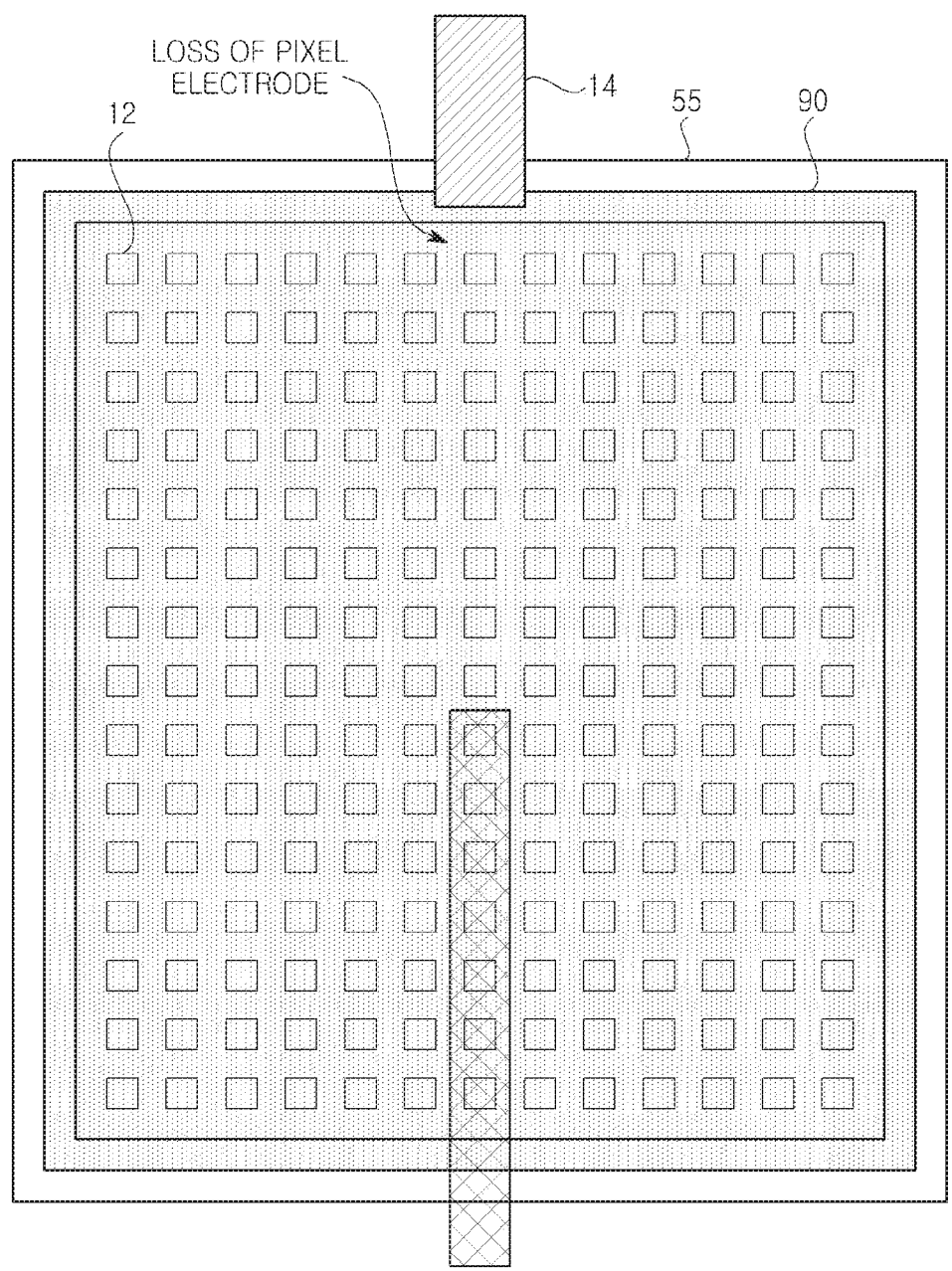
FIG. 4 is a view for describing disconnection of a pixel bar that occurs in a pad part of the related art LCD device.
Figure 5:
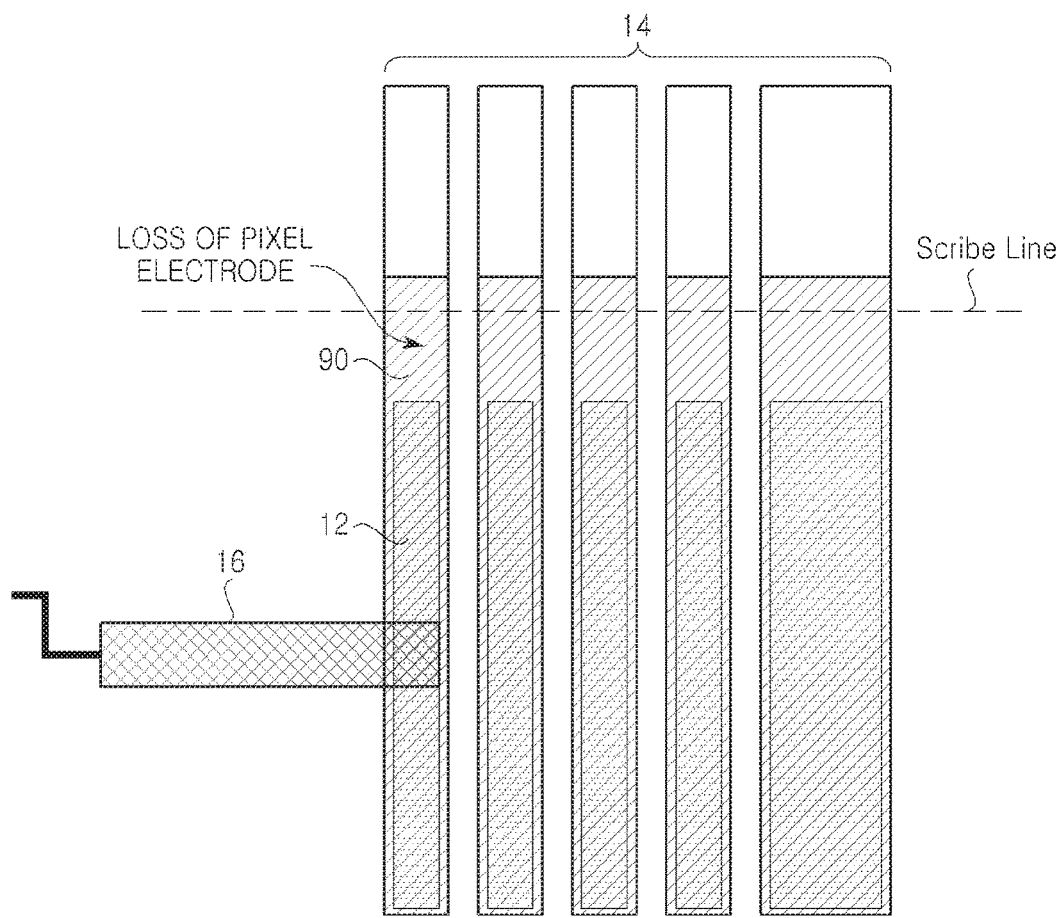
FIG. 5 is a view for describing disconnection of a pixel bar that occurs in a pad part of the related art LCD device.

Reference will now be made in detail to the exemplary embodiments of the present invention, examples of which are illustrated in the accompanying drawings. Wherever possible, the same reference numbers will be used throughout the drawings to refer to the same or like parts.

Hereinafter, an LCD device with integrated touch sensor and a method of manufacturing the same according to embodiments of the present invention will be described with reference to the accompanying drawings.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover a case where a third structure is disposed therebetween.

Furthermore, terms "upper portion/lower portion" and "on/under" are for describing the structure and manufacturing method of the present invention with reference to the drawings. Therefore, the terms "upper portion/lower portion" and "on/under" may differ in structure during a manufacturing process and after manufacturing is completed.

LCD devices have been variously developed in a twisted nematci (TN) mode, a vertical alignment (VA) mode, an in-plane switching (IPS) mode, and a fringe field switching (FFS) mode according to a scheme of adjusting the alignment of liquid crystal.

In the IPS mode and the FFS mode among the modes, a plurality of pixel electrodes and common electrode are arranged on a lower substrate, and thus, the alignment of liquid crystal is adjusted by electric fields between the pixel electrodes and the common electrodes.

In the IPS mode, particularly, the pixel electrodes and the common electrodes are alternately arranged in parallel, and thus, lateral electric fields are respectively generated between the pixel electrodes and the common electrodes, thereby adjusting the alignment of liquid crystal.

In the IPS mode, however, the alignment of liquid crystal is not adjusted in a portion on the pixel electrodes and common electrodes, and thus, light transmittance is reduced in a corresponding area.

To overcome the limitation of the IPS mode, the FFS mode has been proposed. In the FFS mode, a plurality of pixel electrodes and common electrodes are formed apart from each other with an insulating layer therebetween.

In this case, the one electrodes of the pixel electrodes and common electrodes are formed in a plate shape or a pattern, and the other electrodes are formed in a finger shape, thereby adjusting the alignment of liquid crystal with fringe fields generated between the pixel electrodes and common electrodes.

An LCD device with integrated touch sensor (screen) according to embodiments of the present invention includes a liquid crystal panel, a backlight unit that supplies light to the liquid crystal panel, and a driving circuit part. Here, a liquid crystal panel is formed in an in-cell touch type in which a touch sensor for detecting a position touched by a user is built in the liquid crystal panel.

The driving circuit part includes a timing controller (T-con), a data driver (D-IC), a gate driver (G-IC), a sensing driver, a backlight driver, and a power supply that supplies a driving source voltage to the drivers.

Here, all or some of the driving circuit part may be formed in a chip on glass (COG) type or a chip on film (chip on flexible printed circuit, COF), on a liquid crystal panel.

Figure 7:
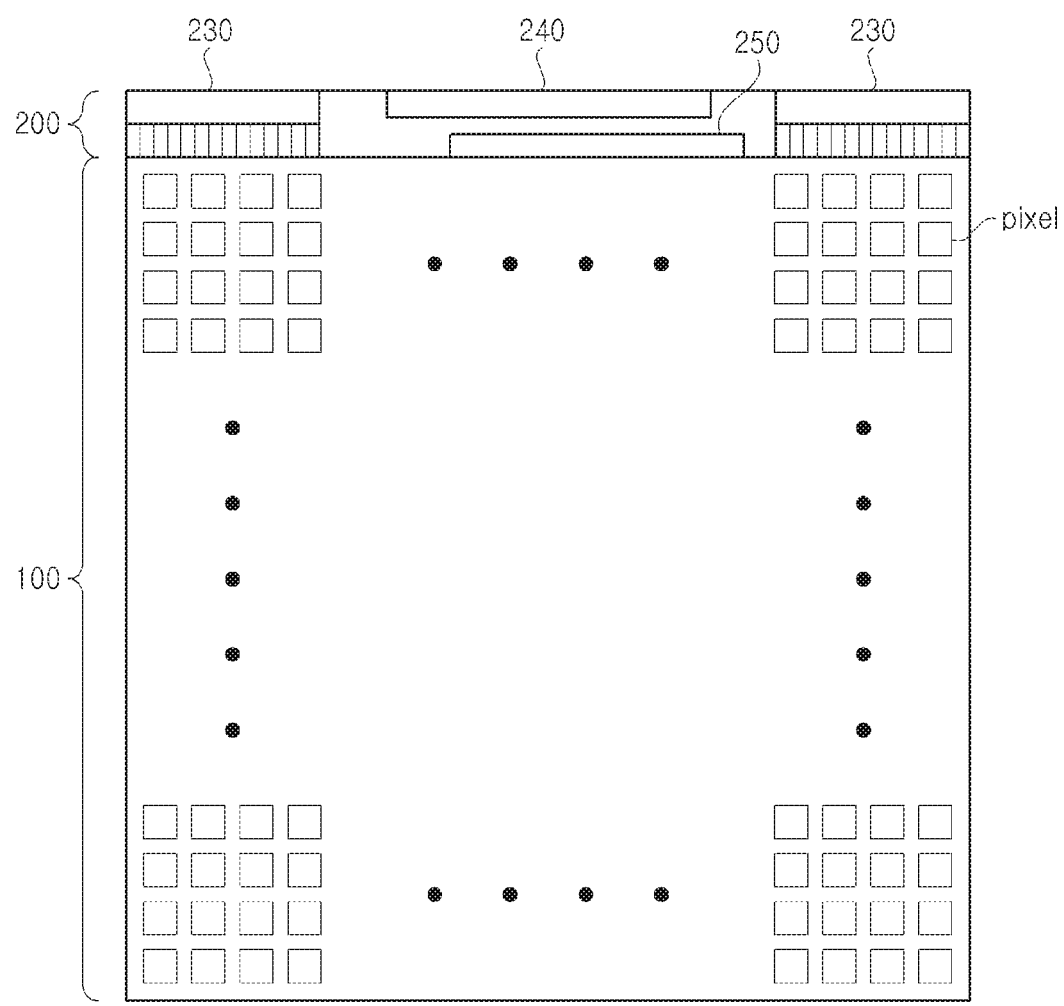
FIG. 7 is a view illustrating an LCD device according to an embodiment of the present invention.
Figure 8:
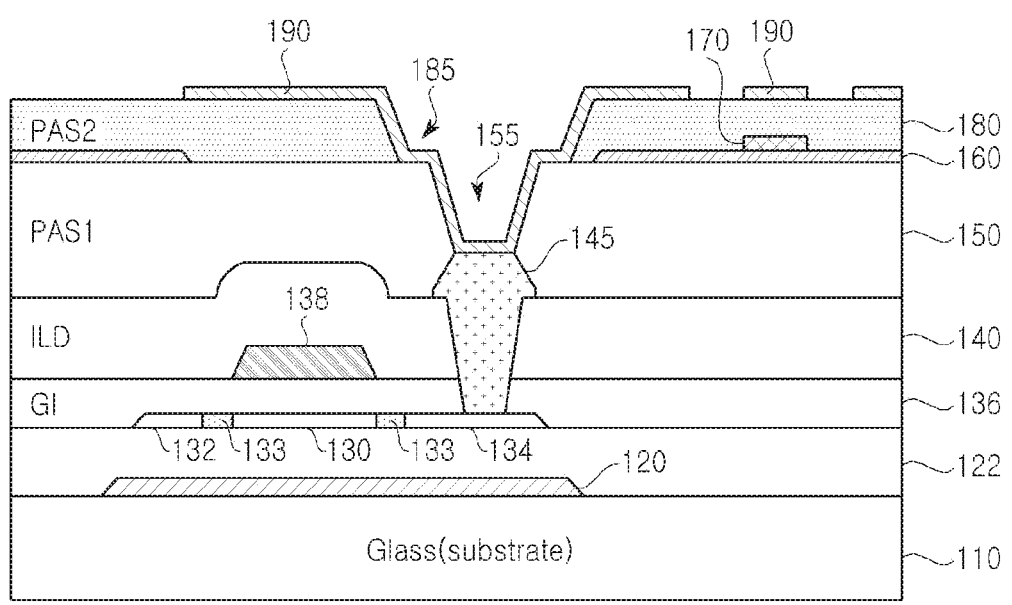
FIG. 8 is a view illustrating a pixel structure of an LCD device according to a first embodiment of the present invention.

FIG. 7 is a view illustrating an LCD device according to an embodiment of the present invention. FIG. 8 is a view illustrating a pixel structure of an LCD device according to a first embodiment of the present invention;

In FIGS. 7 and 8, the structure of a thin film transistor (TFT) array substrate (lower substrate) is illustrated in the FFS mode. In FIGS. 7 and 8, a touch sensor is illustrated as being internalized in an in-cell touch type in the TFT array substrate.

In FIGS. 7 and 8, a color filter array substrate (upper substrate), a liquid crystal layer, a backlight unit, and a driving circuit part are not illustrated.

Referring to FIG. 7, an active area 100 displaying an image is formed at a TFT array substrate, and an inactive area is formed at an outer portion of the active area 100. A plurality of pixels are formed in the active area 100. Furthermore, a plurality of pad parts 230, 240 and 250 are formed in the inactive area 200.

The plurality of pad parts 230, 240 and 250 formed in the inactive area 200 include a unit on-off pad part 230, a unit FPC pad/unit FPC shorting connection part 240, and a bump input dummy/bump output dummy part 250.

In FIG. 7, the pad parts 230, 240 and 250 are illustrated as being formed at an outer portion of an upper end of a panel, but may be formed at an outer portion of a left/right side of the panel and an outer portion of a lower end of the panel.

A plurality of pixels formed in the active area are defined by respective intersections between a plurality of data lines (not shown) and gate lines (not shown). A TFT is formed in each of a plurality of areas in which the data lines intersect the gate lines.

The plurality of pixels are formed at the TFT array substrate, and defined by respective intersections between the data lines (not shown) and the gate lines (not shown).

A TFT is formed in each of a plurality of areas in which the data lines intersect the gate lines. Also, each of the pixels includes a common electrode and a pixel electrode.

Referring to FIG. 8, the TFT array substrate includes a glass substrate 110, a light shield 120, a buffer layer 122, a gate insulator 136, a data contact 145, a inter-layer dielectric (ILD) 140, a first passivation layer 150, a common electrode 160, a touch sensing line 170, a second passivation layer 180, a pixel electrode 190, and a TFT that includes an active 130, a source 132, a drain 134, and a gate 138. Here, the TFT includes a lightly doped drain (LDD) 133.

In an upper portion of the glass substrate 110, the light shield 120 is formed in a TFT area, and the buffer layer 122 is formed to cover the light shield 120. The light shield 120 may be formed of Mo or Al, and have a thickness of 500 Å.

The buffer layer 122 may be formed of an inorganic material, for example, $SiO_2$ or $SiNx$, and have a thickness of 2,000 Å to 3,000 Å.

The active 130, source 132, and drain 134 of the TFT are formed in an area overlapping the light shield 120, on the buffer layer 122 in the TFT area.

Here, the active 130 may be formed of poly silicon (P—Si), and have a thickness of 500 Å. The LDD 133, the source 132, and the drain 134 may be formed by doping P-type impurities or N-type impurities on a semiconductor layer.

The gate insulator 136 is formed to cover the active 130, the source 132, and the drain 134 on the buffer layer 122. In this case, the gate insulator 136 may be formed of $SiO_2$, and have a thickness of 1,300 Å.

The gate insulator 136 may be formed by depositing tetra ethyl ortho silicate (TEOS) or middle temperature oxide (MTO) in a chemical vapor deposition (CVD) process.

In an upper portion of the gate insulator 136, the light shield 120 is formed in an area overlapping the active 130. In this case, the gate 138 may be formed of Al or Mo, and have a thickness of 3,000 Å.

In this way, the gate 138 and the active 130, source 132, and drain 134 are formed with the gate insulator 136 therebetween, thereby forming the TFT.

The inter-layer dielectric 140 is formed to cover the gate 138, on the gate insulator 136.

In this case, the inter-layer dielectric 140 may be formed of $SiO_2$ or $SiNx$, and have a thickness of 6,000 Å. As another example, the inter-layer dielectric 140 may be formed in a structure in which $SiO_2$ (3,000 Å) and $SiNx$ (3,000 Å) are stacked.

A portion of the gate insulator 136 and a portion of the inter-layer dielectric 140 are etched to expose a top of the drain 134, and the data contact 145 is formed at a portion in which the gate insulator 136 and the inter-layer dielectric 140 are etched. The data contact 145 contacts the drain 134.

The data contact 145 contacts the drain 134 and the pixel electrode 190. In this case, the data contact 145 may be formed to have a thickness of 6,000 Å, and formed in a structure in which Mo, Al, and Mo are stacked.

The first passivation layer (PAS1) 150 is formed to cover the data contact 145, on the inter-layer dielectric 140. Here, the first passivation layer 150 is formed of photo acryl, and has a thickness of 3 um.

The common electrode 160 is formed on the first passivation layer 150, in the pixel area.

The common electrode 160 may be formed of a transparent conductive material, such as indium tin oxide (ITO), indium zinc oxide (IZO), or indium tin zinc oxide (ITZO), to have a thickness of 500 Å.

The touch sensing line 170 is formed on the common electrode 160. The conductive line 170 is formed to cross the plurality of pixels, and connects the common electrodes 160 of adjacent pixels. Therefore, the common electrode 160 acts as a touch sensing electrode during a non-display period.

Here, the touch sensing line 170 may be formed of Mo or Al, and have a thickness of 1,500 Å to 2,000 Å. The touch sensing line 170 may be formed in a structure in which Mo, Al, and Mo are stacked.

The touch sensing line 170 connects the common electrodes 160 of adjacent pixels to form a touch block. In this case, the touch block includes a touch row block for detecting a touch position in an X-axis direction, and a touch column block for detecting a touch position in a Y-axis direction.

The touch sensor detects X-axis and Y-axis coordinates for detecting a position touched by a user. Therefore, the touch row block and the touch column block are required to be separated from each other without contact therebetween.

To this end, the touch sensing line 170 in the touch column block is connected in the Y-axis direction by using a conductive line that is formed to overlap the data line of the TFT array substrate. Therefore, the touch sensing line 170 in the touch column block enables the detection of a position touches by a user in the Y-axis direction.

The touch sensing line 170 in the touch row block avoids contact with the touch column block by using a bride line that is formed simultaneously with a gate line formed on the TFT array substrate. The touch sensing line 170 in the touch row block enables the detection of a position touches by a user in the X-axis direction. For example, the bridge line disposed in a central portion of the pixel to block disclination of the multi-domain pixel region, the bridge line being parallel with the gate line.

As described above, the touch row block and the touch column block are separated from each other, thereby enabling the detection of a position touched by a user in the X-axis direction and the Y-axis direction.

A second passivation layer 180 is formed to cover the common electrode 160 and the touch sensing line 170, on the first passivation layer 150. Here, the second passivation layer 180 may be formed of $SiO_2$ or SiNx, and have a thickness of 2,000 Å to 3,000 Å.

A first contact hole 155 is formed in an area overlapping the data contact 145, in the first passivation layer 150.

The second passivation layer 180 is etched to form a second contact hole 185, on the first contact hole 155.

The pixel electrode 190 is formed in a finger shape in the pixel area, on the second passivation layer 180. The pixel electrode 190 is formed in the first and second contact holes 155 and 185, and contacts the data contact 145. Through such a contact structure, the drain 134 of the TFT contacts the pixel electrode 190 via the data contact 145.

In this case, the pixel electrode 190 may be formed of a transparent conductive material, such as ITO, IZO, or ITZO, to have a thickness of 500 Å.

The second passivation layer 180 and the pixel electrode 190 may be simultaneously formed by a single mask process by using one half tone mask (HTM).

The LCD device according to an embodiment of the present invention adjusts the transmittance of light, which passes through a liquid crystal layer, with data voltages applied to the respective pixel electrodes of the pixels and a common voltage applied to the common electrodes during a display period, thereby displaying an image realized with image signals.

Furthermore, the LCD device drives the respective common electrodes 160 of the pixels, connected by the touch sensing line 170, as touch sensing electrodes during the non-display period, thereby sensing the change in a capacitance (Ctc) due to a user's touch. The LCD device compares a capacitance generated by the user's touch and a reference capacitance to detect a touch position (TS).

Figure 9:
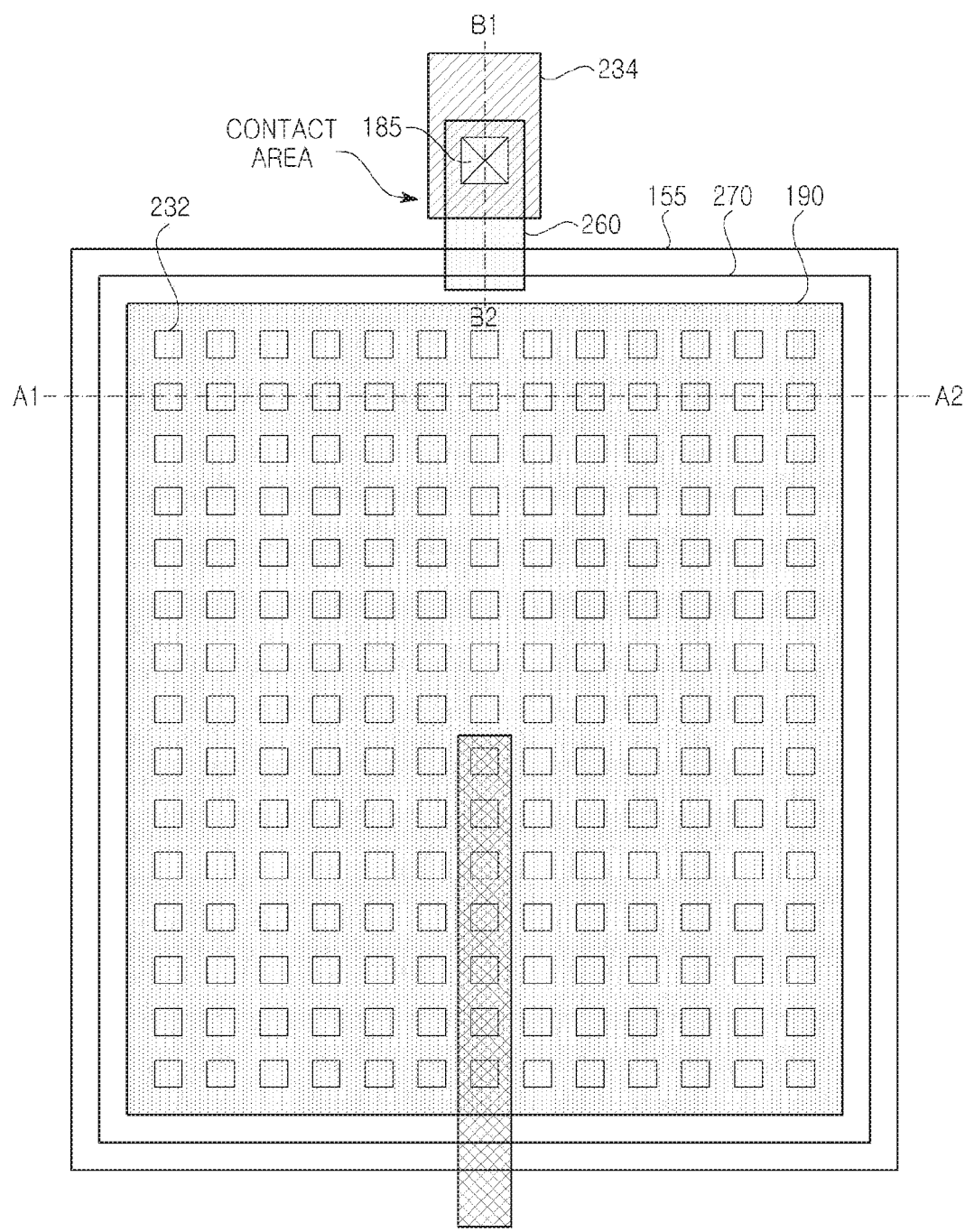
FIG. 9 is a view illustrating a pad part of an LCD device according to a first embodiment of the present invention.
Figure 10:
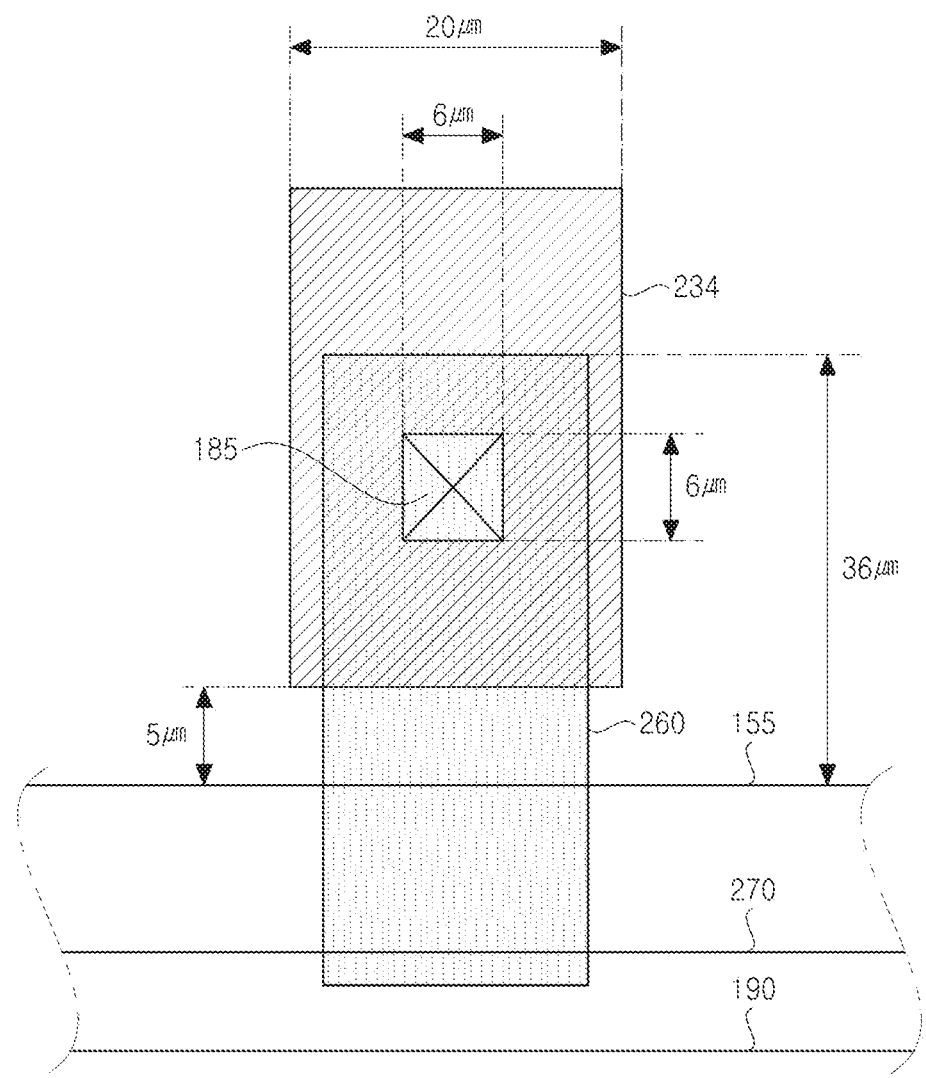
FIG. 10 is an enlarged view of a contact area of FIG. 9.

FIG. 9 is a view illustrating a pad part of an LCD device according to a first embodiment of the present invention. FIG. 10 is an enlarged view of a contact area of FIG. 9.

In FIGS. 9 and 10, the unit on-off pad part 230 among the pad parts 230, 240 and 250 is illustrated.

Referring to FIGS. 9 and 10, the unit on-off pad part 230 among the pad parts 230, 240 and 250 includes a plurality of pixel pads 232 and pixel bars (pixel lines) 234.

The unit on-off pad part 230 formed at an outer portion of the panel is formed through a manufacturing process of forming the pixels. At this point, the first contact hole 155 is formed by broadly etching the first passivation layer (PAS1) 150. The unit on-off pad part 230 has a structure in which the pixel pads and the second contact holes 185 of the second passivation layer 180 are arranged in the first contact hole 155.

The connection of the pixel bar 234 is made using the first contact hole 155 portion. Therefore, the pixel pads 232 and the second contact holes are arranged in the first contact hole 155.

Moreover, in the unit on-off pad part 230, a lower metal 270 and the pixel electrode 190 are formed inside the first contact hole 155.

Here, the lower metal 270 of the unit on-off pad part 230 may be formed of metal that is used when forming the touch sensing line formed in the pixel area. As another example, the lower metal 270 of the unit on-off pad part 230 may be formed of a transparent conductive material that is used when forming the common electrode formed in the pixel area.

The unit on-off pad part 230 is formed for a contact instead of an electrode to which a pixel voltage for image display is supplied. The pixel electrode 190 of the unit on-off pad part 230 is formed of the same material as that of the pixel electrode in the pixel area when forming the pixel electrode.

The pixel bar 234 and the pixel pad 232 are formed apart from each other, and thus are not directly connected. The pixel bar 234 and the pixel pad 232 are connected through the lower metal 270 and the contact pattern 260.

To this end, the second contact hole 185 is formed in the second passivation layer 180 formed on the pixel bar 234. A contact pattern 260 is formed to contact the pixel bar 234, in the second contact hole 185. Furthermore, the contact pattern 260 is formed to contact the lower metal 270, in the first contact hole 155.

In this way, the pixel bar 234 and the pixel pad 232 are connected using the contact pattern 260.

Here, the contact pattern 260 is formed of a transparent conductive material, on the same layer as that of the common electrode 160 in the pixel area. A contact between the pixel bar 234 and the pixel pad 232 is formed by connecting the contact pattern 260 to the lower metal 270 connected to the pixel pad 232.

The pixel bar 234 is formed to have a width of 20 um and a length of 36 um. The pixel bar 234 is formed to be separated by a distance of 5 um from the first contact hole 155 so as not to overlap the first contact hole 155.

The second contact hole 185 formed on the pixel bar 234 may be formed in a 6 um×6 um size.

The second contact hole 185 is formed in the first contact hole 155 inside the unit on-off pad part 230. In this case, the second contact hole 185 is formed to have a size similar to that of the lower metal 270. One side of the lower metal 270 is formed to have a size less by 10 um than that of the second contact hole 185, such that a contact between the lower metal 270 and the contact pattern 260 is smoothly made.

Here, to prevent the contact of the pixel bar 234 from being broken at a boundary surface of the first contact hole 155, the lower metal 270 is used as a bridge for a contact between the pixel bar 234 and the pixel pad 232. Comparing with the related art, the length of the lower metal 270 of the present invention is expanded, and thus the lower metal 270 contacts the pixel bar 234 with the pixel pad 232.

A contact area of the pixel bar 234 uses a clear area in a manufacturing process. In this case, the clear area is formed to have a size less than that of the lower metal 270. When forming the second contact 185 by etching the second passivation layer 180, the lower metal 270 act as an etch stop.

Comparison between relative sizes of respective elements is as follows. The clear area of the first passivation layer is the greatest size, and the lower metal 270 has the second greatest size. The pixel electrode 190 has the smallest size. The pixel electrode 190 and the clear area of the second passivation layer 180 have the same size. That is, the clear area of the first passivation layer (PAS1)>the lower metal >the pixel electrode=the clear area of the second passivation layer (PAS2).

Even in the unit FPC pad/unit FPC shorting connection part 240 and the bump input dummy/bump output dummy part 250, identically to the unit on-off pad part 230, contacts between pad patterns and a signal line (shorting bar) may be made using the lower metal 270 and the contact pattern 260 as a bridge.

In the pad part of the LCD device (having the above-described structure) according to an embodiment of the present invention, the second contact hole 185 is formed in the pixel bar 234, and the pixel bar 234 may be connected to the pixel pad 232 in the pad area by using the lower metal 270 and the contact pattern 260 as a bridge. Therefore, the second passivation layer 180 and the pixel electrode 190 can be simultaneously formed using the half tone mask, and a defective contact can be prevented in the pad area.

FIGS. 11 to 15 are views illustrating a method of manufacturing an LCD device according to an embodiment of the present invention. Here, FIGS. 11 to 15 illustrate a manufacturing process with respect to a sectional surface along line A1-A2 and line B1-B2 of FIG. 9. In FIGS. 11 to 15, a manufacturing method of forming a pixel in the active area is not illustrated.

Hereinafter, the method of manufacturing the LCD device according to an embodiment of the present invention will be described with reference to FIGS. 11 to 15. A sectional view taken along line A1-A2 illustrates a portion corresponding to one pixel pad in the pad area. A sectional view taken along line B1-B2 illustrates a portion corresponding to one pixel pad in the pad area.

Figure 11:
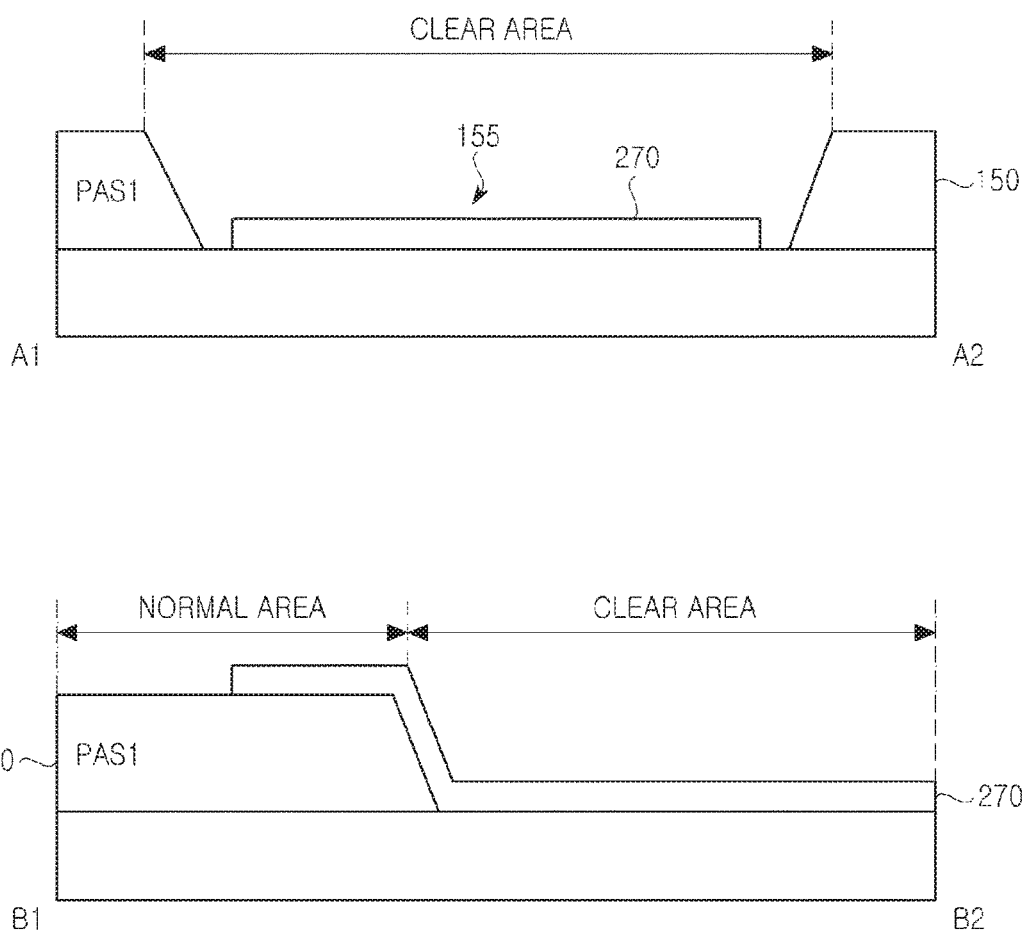

Referring to FIG. 11, the first passivation layer (PAS1) 150 is formed in a pad area and a contact area. Subsequently, a clear area is formed by an etching process and a photolithography process using a half tone mask.

The first contact hole 155 is formed through the clear area of the first passivation layer (PAS1) 150. Here, the first passivation layer 150 may be formed of photo acryl, and have a thickness of 3 um.

Subsequently, the lower metal 270 is formed in the clear area of the contact area and the pad area. In this case, the lower metal 270 formed in the contact area is expanded in size, and thus formed on the first passivation layer 150 in a normal area as well as the clear area.

The lower metal 270 of the unit on-off pad part 230 may be formed of at least one of the transparent conductive material of the common electrode and the metal of the touch sensing line formed in the pixel area.

Here, in a subsequent process, the lower metal 270 acts as an etch stop of the second contact hole 185 that is formed by etching the second passivation layer 180.

Subsequently, referring to FIG. 12, the second passivation layer (PAS2) 180 is formed to cover the first passivation layer 150 and the lower metal 270. Here, the second passivation layer 180 may be formed of $SiO_2$ or SiNx, and have a thickness of 2,000 Å to 3,000 Å.

Figure 13:
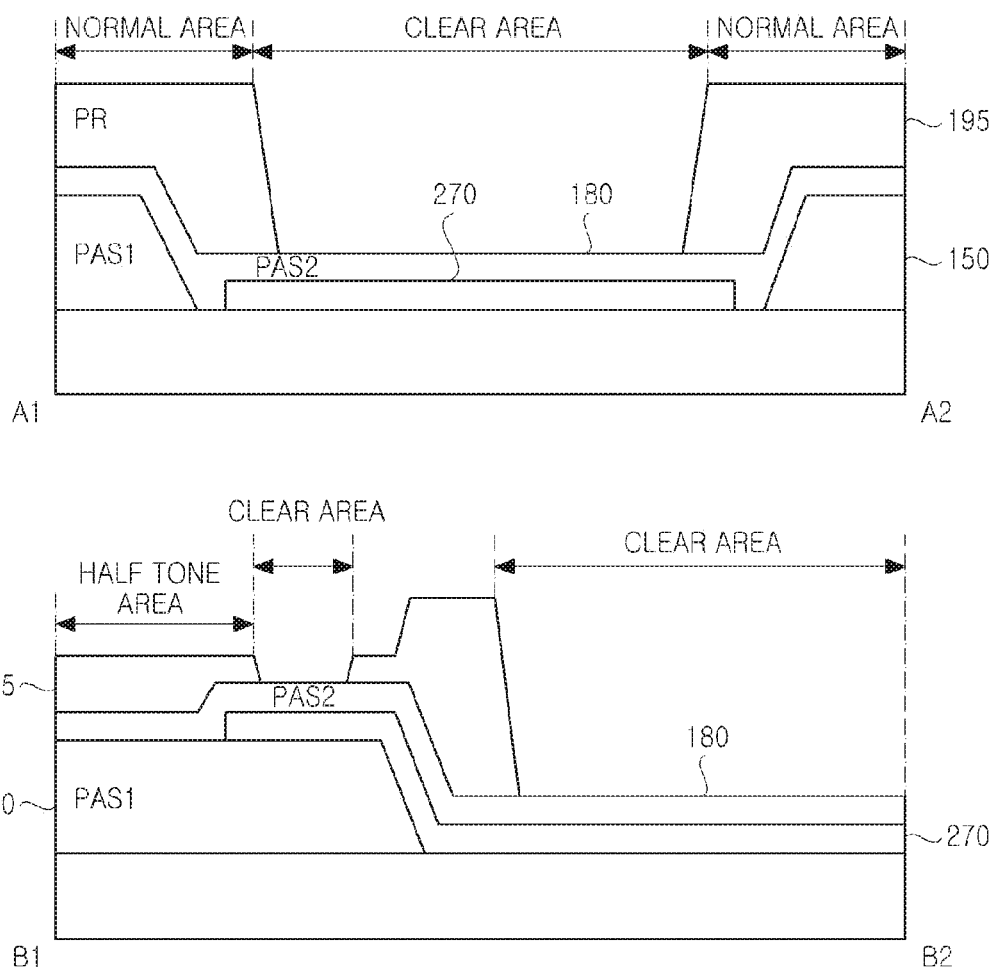

Subsequently, referring to FIG. 13, a photoresist 195 is coated on the second passivation layer 180, and then, the etching process and the photolithography process using the half tone mask are performed.

In the pad area, an area overlapping the lower metal 270, namely, the photoresist 195 on the first contact hole 155 is removed, thereby forming a clear area. In this case, the clear area is formed to have a size less than that of the lower metal 270.

In the contact area, the photoresist 195 on the first contact hole 155 is removed, thereby forming a clear area.

In the photoresist 195 in an area overlapping the normal area of the first passivation layer 150, a portion overlapping the lower metal 270 is removed to form the clear area, and the other portion is formed as a half tone area.

A top of the second passivation layer 180 is exposed by the clear areas that are respectively formed in the pad area and the contact area.

Figure 14:
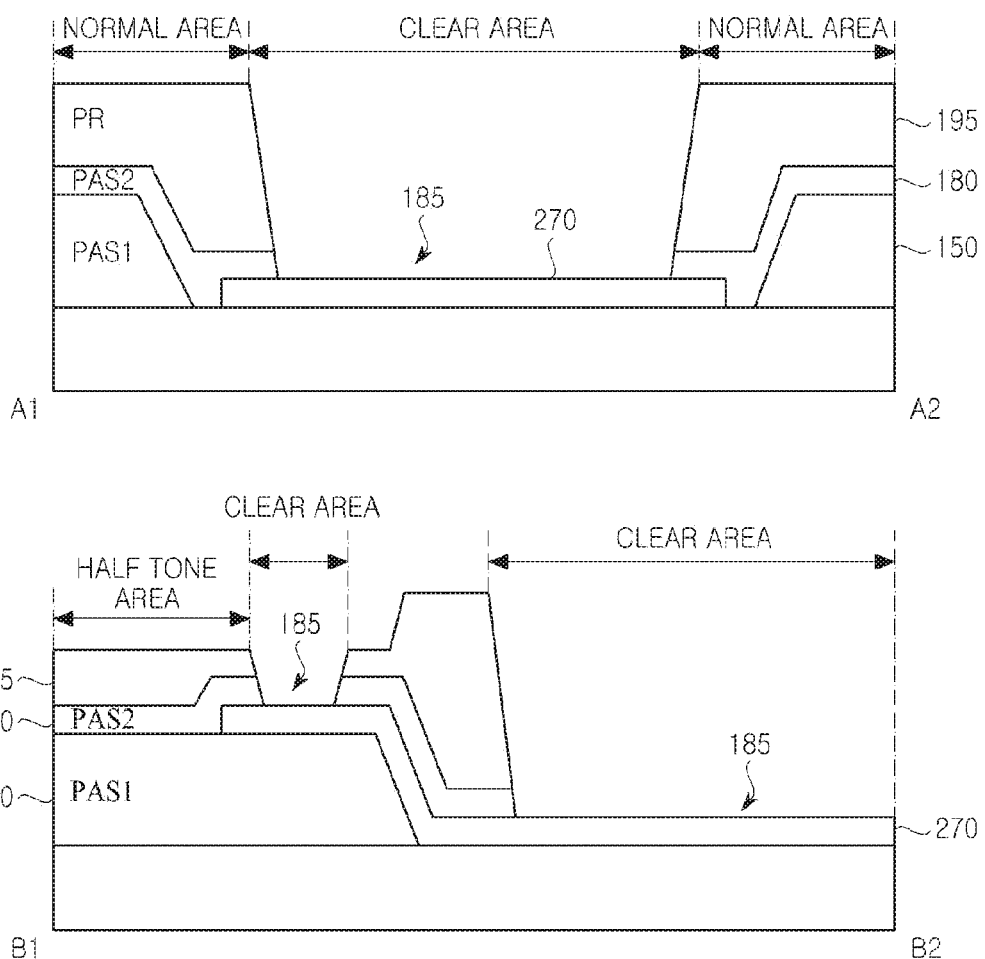

Subsequently, referring to FIG. 14, the second passivation layer 180 exposed by the clear area is removed by performing an ashing process, thereby exposing the lower metal 270.

Specifically, the second passivation layer 180 in the clear area is removed in the pad area, and thus, the second contact hole 185 is formed. The lower metal 270 is exposed by the second contact hole 185.

Moreover, the second passivation layer 180 in the clear area is removed in the contact area, and thus, the second contact hole 185 is formed. In this case, as illustrated in FIGS. 9 and 10, the second contact hole 185 formed in the contact area is formed on the pixel bar 234 to expose the pixel bar 234.

The second contact hole 185 formed on the pixel bar 234 is formed to have a 6 um×6 um size.

The first contact hole 155 and the second contact hole 185 are formed using a clear area of a half tone mask.

Subsequently, referring to FIG. 15, the pixel electrode 190 is formed of a transparent conductive material such as ITO, in the pad area.

Moreover, the contact pattern 260 is formed of a transparent conductive material such as ITO, in an outer portion of the pad area and the contact area.

Here, the pixel bar 234 in the contact area and the pixel pad 232 in the pad area are formed apart from each other, and thus are not directly connected. The pixel bar 234 in the contact area and the pixel pad 232 in the pad area are connected through the lower metal 270 and the contact pattern 260.

As described above, the second contact hole 185 is formed at the second passivation layer 180 formed on the pixel bar 234, and the pixel bar 234 and the pixel pad 232 are connected using the contact pattern 260 as a bridge.

The contact pattern 260 is formed of a transparent conductive material, on the same layer as that of the common electrode 160 in the pixel area. The contact pattern 260 is connected to the lower metal 270 connected to the pixel pad 232. Therefore, the pixel bar 234 contacts the pixel pad 232.

The pixel bar 234 is formed to have a width of 20 um and a length of 36 um. The pixel bar 234 is formed to be separated by a distance of 5 um from the first contact hole 155 so as not to overlap the first contact hole 155.

The second contact hole 185 is formed to have a size similar to that of the lower metal 270. One side of the lower metal 270 is formed to have a size less by 10 um than that of the second contact hole 185, such that a contact between the lower metal 270 and the contact pattern 260 is smoothly made.

To prevent the contact of the pixel bar 234 from being broken at a boundary surface of the first contact hole 155, the lower metal 270 is used as a bridge for a contact between the pixel bar 234 and the pixel pad 232.

Comparing with the related art, the length of the lower metal 270 of the present invention is expanded, and thus the lower metal 270 contacts the pixel bar 234 with the pixel pad 232.

The lower metal 270 that acts as a bridge for contact of the pixel bar 234 may be expanded in length to a lower portion of the pixel bar 234. In this case, the length of the lower metal 270 may be expanded using both the metal of a conductive line and the transparent conductive material of the common electrode. As another example, the length of the lower metal 270 may be expanded using only one of the metal of the conductive line and the transparent conductive material of the common electrode.

Comparison between relative sizes of respective elements is as follows. The clear area of the first passivation layer is the greatest size, and the lower metal 270 has the second greatest size. The pixel electrode 190 has the smallest size. The pixel electrode 190 and the clear area of the second passivation layer 180 have the same size. That is, the clear area of the first passivation layer (PAS1)>the lower metal >the pixel electrode=the clear area of the second passivation layer (PAS2).

According to another embodiment of the present invention, even in the unit FPC pad/unit FPC shorting connection part 240 and the bump input dummy/bump output dummy part 250, identically to the unit on-off pad part 230, contacts between pad patterns and a signal line (shorting bar) may be made using the lower metal 270 and the contact pattern 260 as a bridge.

The sizes of the second contact hole 185 and pixel pad 232 in the second passivation layer 185 formed in the pad area may be changed, in which case the sizes are required to be sizes in which a test is capable of being performed with a probe tip.

In the LCD device and the method of manufacturing the same according to the first embodiment of the present invention, the second passivation layer 180 and the pixel electrode 190 are simultaneously formed by the single mask process using the half tone mask, and thus, manufacturing efficiency increases.

Moreover, in forming the pixel electrode 190, the present invention can prevent disconnection of the pixel bar 234, caused by loss of the pixel electrode 190 due to the lift-off process, in the pad area. Accordingly, the present invention can enhance the contact performance of the pixel bar 234 in the pad area.

Figure 16:
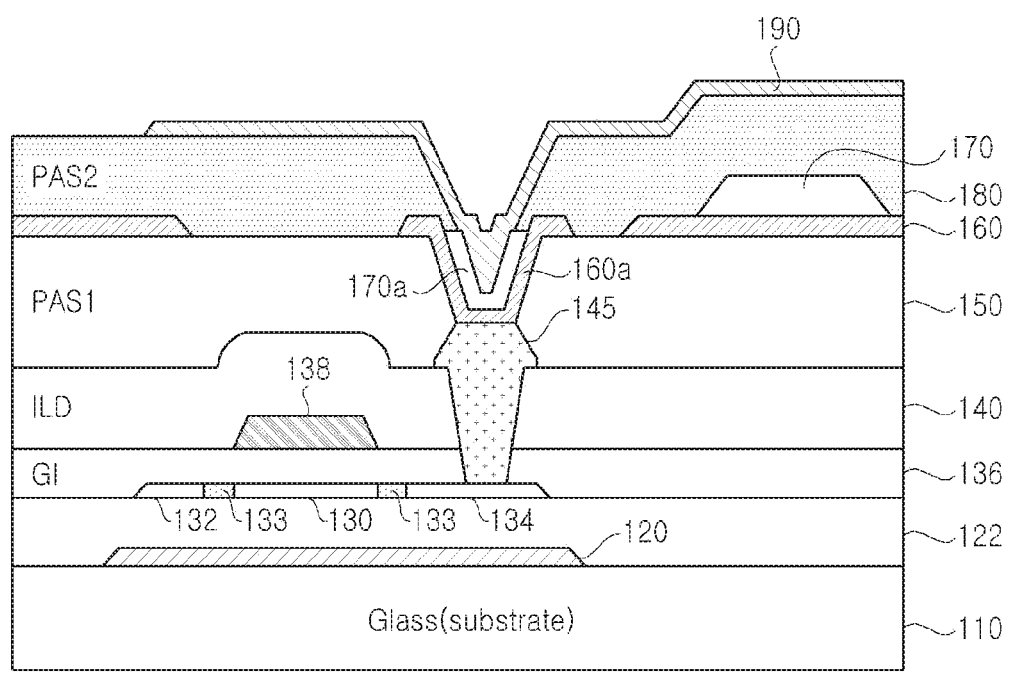
FIG. 16 is a view illustrating a pixel structure of an LCD device according to a second embodiment of the present invention.

FIG. 16 is a view illustrating a pixel structure of an LCD device according to a second embodiment of the present invention. In FIG. 16, a touch sensor is illustrated as being internalized in an in-cell touch type in the TFT array substrate. In FIG. 16, a color filter array substrate (upper substrate), a liquid crystal layer, a backlight unit, and a driving circuit part are not illustrated. The pixel structure of FIG. 8 is similar to that of FIG. 16, and thus, a detailed description on the same element is not provided.

Referring to FIG. 16, a TFT array substrate includes a glass substrate 110, a light shield 120, a buffer layer 122, a gate insulator 136, a data contact 145, a inter-layer dielectric (ILD) 140, a first passivation layer 150, a common electrode 160, a touch sensing line 170, a first contact line 160a, a second contact line 170a, a second passivation layer 180, a pixel electrode 190, and a TFT that includes an active 130, a source 132, an LDD 133, a drain 134, and a gate 138.

A portion of the gate insulator 136 and a portion of the inter-layer dielectric 140 are etched to expose a top of the drain 134. The data contact 145 is formed at a portion in which the gate insulator 136 and the inter-layer dielectric 140 are etched.

The data contact 145 contacts the drain 134 and the pixel electrode 190. The first passivation layer (PAS1) 150 is formed to cover the data contact 145, on the inter-layer dielectric 140.

The common electrode 160 is formed on the first passivation layer 150, in a pixel area.

The touch sensing line 170 is formed on the common electrode 160 to cross a plurality of pixels, and connects the common electrodes 160 of adjacent pixels. Therefore, the common electrode 160 acts as a touch sensing electrode during a non-display period.

The first and second contact lines 160a and 170a are formed on the data contact 145. The first and second passivation layers 150 and 180 are etched to expose a top of the data contact 145, thereby forming a contact hole. The first and second contact lines 160a and 170a are formed inside the contact hole.

Here, the first contact line 160a is formed of the same material as that of the common electrode 160 simultaneously with the common electrode 160 during a manufacturing process. The second contact line 170a is formed of the same material as that of the touch sensing line 170 simultaneously with the touch sensing line 170 during the manufacturing process.

The first and second contact lines 160a and 170a are formed insularly, and thus, a signal and a voltage are not supplied thereto. That is, the first and second contact lines 160a and 170a act as a via between the data contact 145 and the pixel electrode 190.

A second passivation layer 180 is formed to cover the common electrode 160 and the touch sensing line 170, on the first passivation layer 150.

A first contact hole 155 is formed in an area overlapping the data contact 145, in the first passivation layer 150.

The second passivation layer 180 is etched to form a second contact hole 185, on the first contact hole 155.

The pixel electrode 190 is formed in a finger shape in the pixel area, on the second passivation layer 180. The pixel electrode 190 is formed in the first and second contact holes 155 and 185, and contacts the data contact 145.

The second passivation layer 180 and the pixel electrode 190 may be simultaneously formed by a single mask process by using one half tone mask (HTM).

Figure 17:
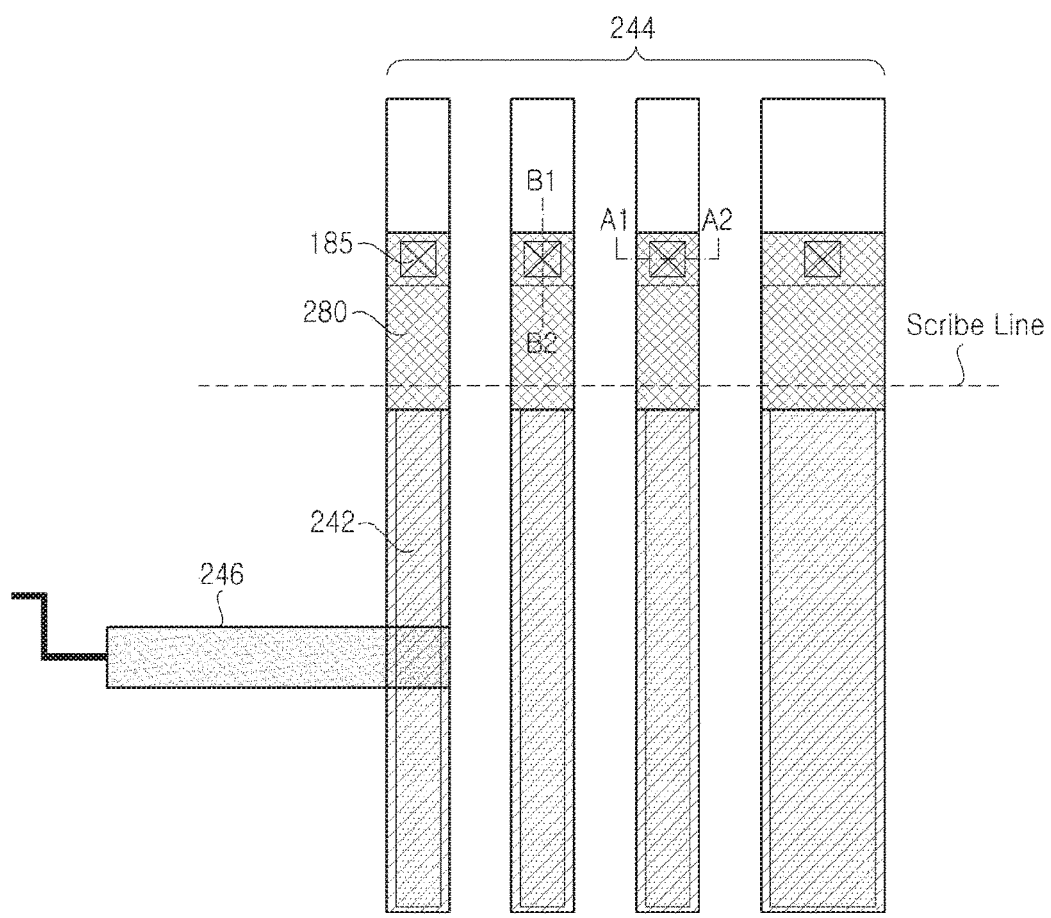
FIG. 17 is a view illustrating a pad part of an LCD device according to a second embodiment of the present invention.
Figure 18:
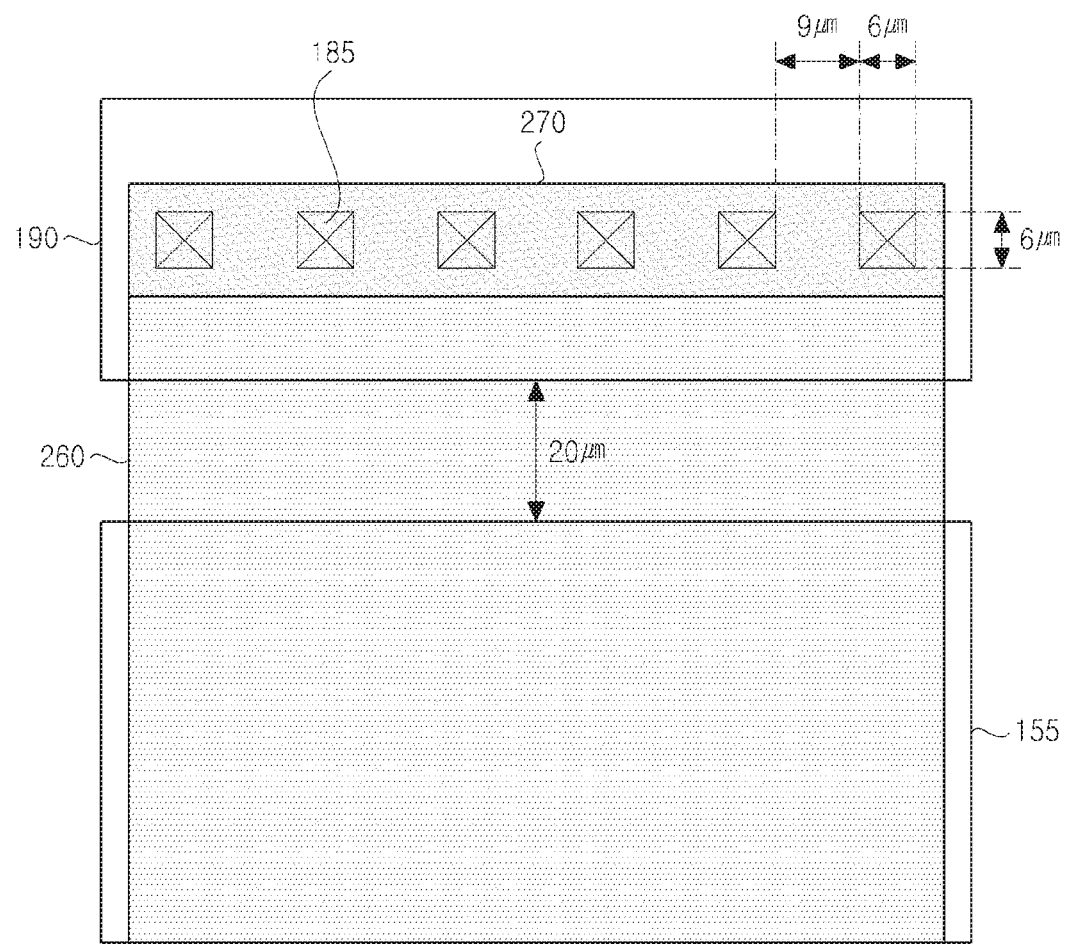
FIG. 18 is an enlarged view of a contact area of the pad part of FIG. 17.
Figure 19:
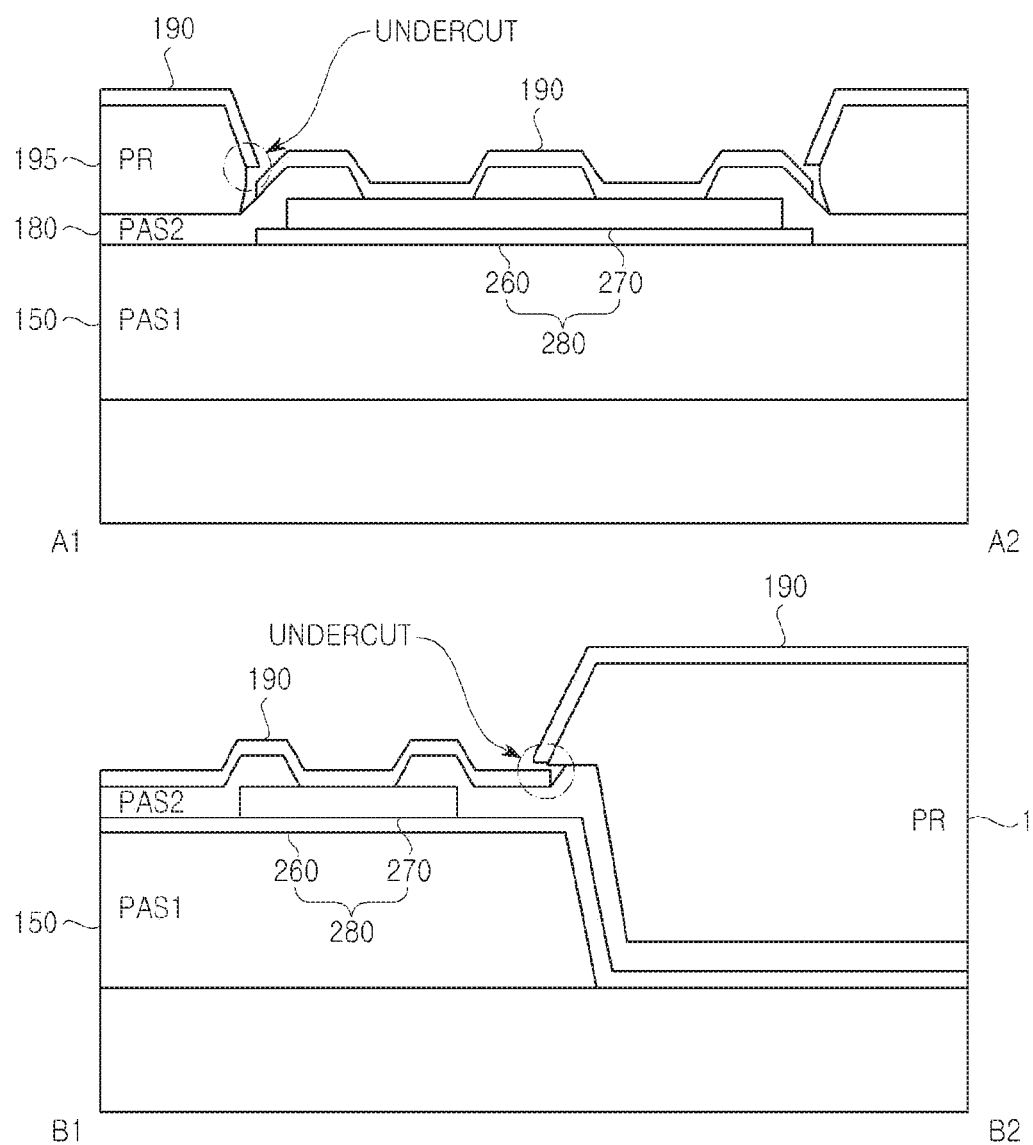
FIG. 19 is a sectional view taken along line A1-A2 and line B1-B2 of FIG. 17.

FIG. 17 is a view illustrating a pad part of an LCD device according to a second embodiment of the present invention. FIG. 18 is an enlarged view of a contact area of the pad part of FIG. 17. FIG. 19 is a sectional view taken along line A1-A2 and line B1-B2 of FIG. 17.

In FIGS. 17 to 19, a unit FPC pad/unit FPC shorting connection part 240 among a plurality of pad parts 230, 240 and 250 is illustrated.

Referring to FIGS. 17 to 19, the unit FPC pad/unit FPC shorting connection part 240 among the pad parts 230, 240 and 250 includes a plurality of pads 242, a plurality of pixel bars (pixel lines) 244, and a power line 246.

The unit FPC pad/unit FPC shorting connection part 240 includes a pad area in which the pads 242 are formed, and a contact area in which the pixel bar 244 contacts the pad 242.

The unit FPC pad/unit FPC shorting connection part 240 is formed by a manufacturing process of forming a plurality of pixels. Here, the unit FPC pad/unit FPC shorting connection part 240 has a structure in which a pad pattern for supplying a signal to a pixel are arranged in each of the pads 242.

Moreover, a lower metal 270 and the pixel electrode 190 are formed in the contact area of the unit FPC pad/unit FPC shorting connection part 240. In this case, the lower metal 270 and pixel electrode 190 formed in the contact area are formed apart from the first contact hole 155.

The pixel bar 244 and pad 242 of the unit FPC pad/unit FPC shorting connection part 240 are formed to be separated from each other, and thus are not directly connected. The pixel bar 244 and the pad 242 are connected through a bridge layer 280 that is configured with the contact pattern 260 and the lower metal 270.

The bridge layer 280 may be configured with the contact pattern 260 and the lower metal 270.

The contact pattern 260 and the common electrode 160 in the pixel area may be formed on the same layer. The contact pattern 260 is formed of a transparent conductive material (ITO) which is the material of the common electrode 160.

The lower metal 270 may be formed using the metal of the touch sensing line 170 formed in the pixel area. When forming the touch sensing line 170, the lower metal 270 is formed of the same material as that of the touch sensing line 170.

To connect the pixel bar 244 and the pad 242, the second contact hole 185 is formed in the second passivation layer 180 on the pixel bar 244. The pixel electrode 190 is formed on the second passivation layer 180 and in the second contact hole 185. The contact pattern 260 is formed in the first contact hole 155. The lower metal 270 is formed on the contact pattern 260, in an area in which the second contact hole 185 is formed. That is, the contact pattern 260 and the lower metal 270 are stacked in an area in which the second contact hole 185 is formed. In this way, the pixel bar 244 and the pad 242 are connected with the bridge layer 280 that is configured with the contact pattern 260 and the lower metal 270.

When simultaneously forming the second passivation layer 180 and the pixel electrode 190 in an etching process, a lift-off process, and a photolithography process using a half tone mask, the pixel electrode 190 may be lost in the contact area. However, even when the pixel electrode 190 is lost in the contact area, a contact is not disconnected because the pixel bar 244 and the pad 242 are connected with the bridge layer 280.

Here, the pixel bars 234 are formed to be separated by a distance of 10 um to 20 um from each other so as not to overlap the first contact hole 155.

The second contact hole 185 formed on the pixel bar 234 may be formed in a 6 um×6 um size.

The second contact hole 185, as illustrated in FIG. 17, may be formed as one on one pixel bar 244, but is not limited thereto. To more enhance the contact performance of the pixel bar 244, as illustrated in FIG. 18, a plurality of the second contact holes 185 may be formed in one pixel bar 244.

A contact area of the pixel bar 234 is formed using a clear area in a manufacturing process. In this case, the clear area is formed to have a size less than that of the lower metal 270. When forming the second contact 185 by etching the second passivation layer 180, the lower metal 270 act as an etch stop.

As illustrated in FIG. 19, the second contact hole 185 formed in the contact area is formed to have a size less than that of the lower metal 270. As an example, the second contact hole 185 is formed to have a size less by 10 um than that of one side of the lower metal 270.

In addition to the unit FPC pad/unit FPC shorting connection part 240, the unit on-off pad part 230 and the bump input dummy/bump output dummy part 250 may also connect the pad 242 and the pixel bar 244 by using the above-described bridge layer 280.

In the pad part of the LCD device (having the above-described structure) according to an embodiment of the present invention, the second contact hole 185 is formed in the pixel bar 244, and the pixel bar 234 may be connected to the pixel pad 232 in the pad area by using the bridge layer 280 configured with the lower metal 270 and the contact pattern 260. Therefore, the second passivation layer 180 and the pixel electrode 190 can be simultaneously formed using the half tone mask, and the defective contact of the pixel bar 244 can be prevented in the pad area.

FIGS. 20 to 24 are views illustrating a method of manufacturing an LCD device according to an embodiment of the present invention.

FIGS. 20 to 24 illustrate a manufacturing process with respect to a sectional surface along line A1-A2 and line B1-B2 of FIG. 17. In FIGS. 20 to 24, a manufacturing method of forming a pixel in the active area is not illustrated.

Hereinafter, the method of manufacturing the LCD device according to an embodiment of the present invention will be described with reference to FIGS. 20 to 24. A sectional view taken along line A1-A2 illustrates a portion corresponding to one pixel pad in the pad area. A sectional view taken along line B1-B2 illustrates a portion corresponding to one pixel pad in the pad area.

Referring to FIG. 20, the first passivation layer (PAS1) 150 is formed in a pad area and a contact area.

Subsequently, in the contact area, a portion of the first passivation layer (PAS1) 150 is etched by performing an etching process and a photolithography process using a half tone mask. The etched portion of the first passivation layer 150 becomes the first contact hole 155. The first passivation layer 150 may be formed using the clear area of the half tone mask.

In this case, the first passivation layer 150 may be formed of photo acryl, and have a thickness of 3 um.

Subsequently, the bridge layer 280 is formed by sequentially forming the contact pattern 260 and the lower metal 270 in the pad area and the contact area.

In this case, in the contact area, the contact pattern 260 is formed on the first passivation layer 150 and in the first contact hole 155 area. The lower metal 270 is formed only on the first passivation layer 150.

Here, in a subsequent process, the lower metal 270 acts as an etch stop of the second contact hole 185 that is formed by etching the second passivation layer 180.

Subsequently, referring to FIG. 21, the second passivation layer (PAS2) 180 is formed on the first passivation layer 150 and in the first contact hole 155 area. Here, the bridge layer 280 is covered by the second passivation layer 180. The second passivation layer 180 may be formed of $SiO_2$ or SiNx, and have a thickness of 2,000 Å to 3,000 Å.

Subsequently, referring to FIG. 22, a photoresist 195 is coated on the second passivation layer 180, and then, the etching process and the photolithography process using the half tone mask are performed.

In the pad area, a portion of the photoresist 195 partially overlapping the bridge layer 280 is removed, thereby forming a clear area. In this case, the clear area is formed to have a size less than that of the lower metal 270.

In the contact area, a portion of the photoresist 195 partially overlapping the bridge layer 280 is removed, thereby forming a clear area.

A portion of the photoresist 195 that does not overlap the bridge layer 280 forms a half tone area or a normal area.

A top of the second passivation layer 180 is exposed by the clear areas that are respectively formed in the pad area and the contact area.

Subsequently, referring to FIG. 23, the second passivation layer 180 exposed by the clear area is removed by performing an ashing process, thereby exposing the bridge layer 280.

Specifically, the second passivation layer 180 in the clear area is removed in the pad area, and thus, the second contact hole 185 is formed. The bridge layer 280 is exposed by the second contact hole 185.

Moreover, the second passivation layer 180 in the clear area is removed in the contact area, and thus, the second contact hole 185 is formed. In this case, the second contact hole 185 formed in the contact area is formed on the pixel bar 244 to expose the pixel bar 244.

The second contact hole 185 formed on the pixel bar 234 is formed to have a 6 um×6 um size.

The second contact hole 185, as illustrated in FIG. 17, may be formed as one on one pixel bar 244, but is not limited thereto. To more enhance the contact performance of the pixel bar 244, as illustrated in FIG. 18, a plurality of the second contact holes 185 may be formed in one pixel bar 244.

The first contact hole 155 and the second contact hole 185 are formed using a clear area of a half tone mask.

Figure 24:
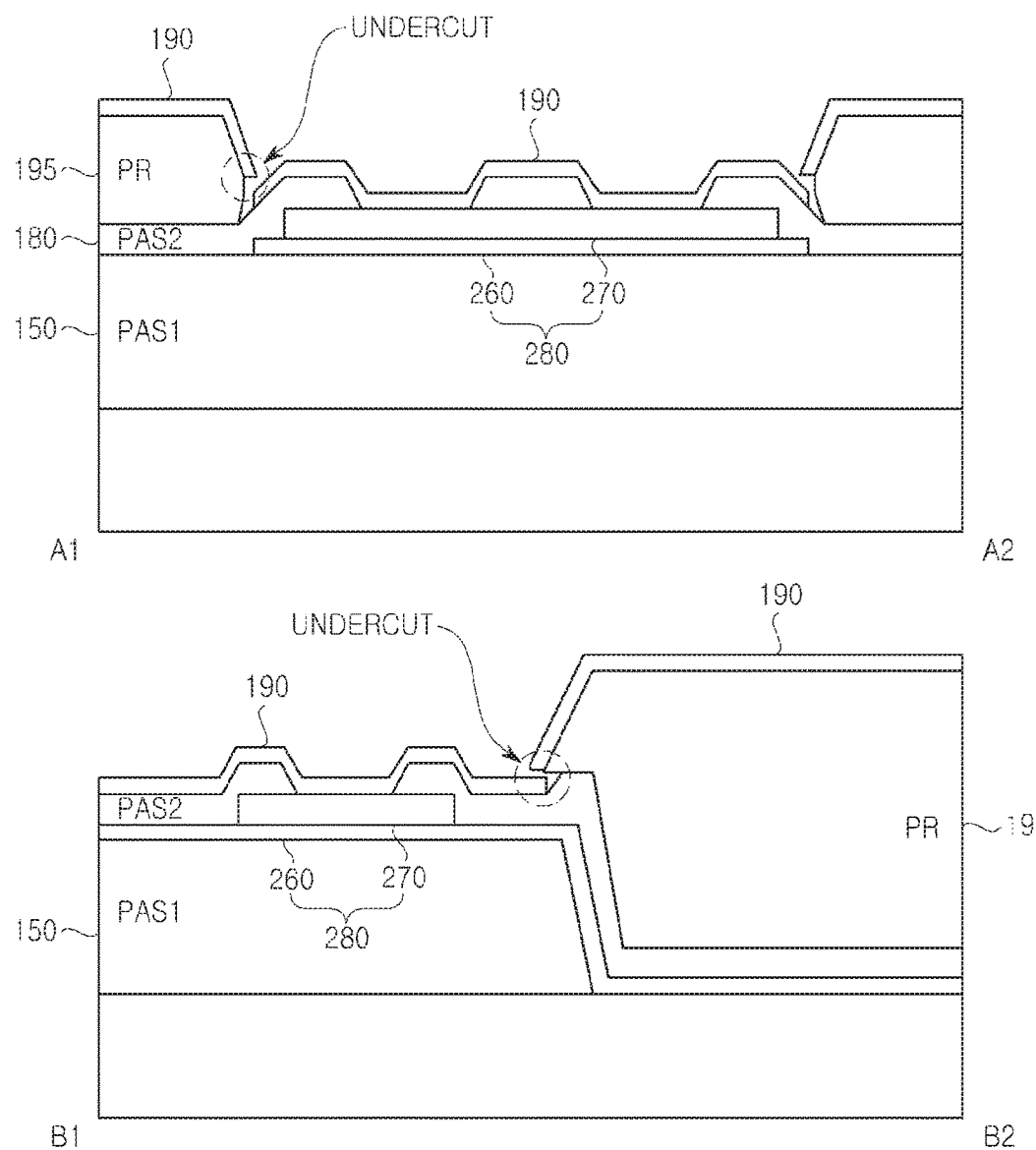

Subsequently, referring to FIG. 24, the pixel electrode 190 is formed of a transparent conductive material such as ITO, in the pad area.

Moreover, the pixel electrode 190 is formed of a transparent conductive material such as ITO, in an outer portion of the pad area and the contact area.

Here, the pixel bar 244 in the contact area and the pad 242 in the pad area are formed apart from each other, and thus are not directly connected. The pixel bar 234 in the contact area and the pixel pad 232 in the pad area are connected through the bridge layer 280.

Accordingly, by performing the lift-off process for simultaneously forming the second passivation layer 180 and the pixel electrode 190, a contact between the pad 242 and the pixel bar 244 is not disconnected even when the pixel electrode 190 is partially lost in the pad area.

Here, the pixel bar 234 is formed to be separated by a distance of 20 um from the first contact hole 155 so as not to overlap the first contact hole 155.

The second contact hole 185 formed in the contact area is formed to have a size less than that of the lower metal 270. As an example, the second contact hole 185 is formed to have a size less by 10 um than that of one side of the lower metal 270.

To prevent the contact of the pixel bar 234 from being broken at a boundary surface of the first contact hole 155, by expanding the length of the contact pattern 260 in the bridge layer 280 in the contact area, the contact pattern 260 is used as a bridge for a contact between the pixel bar 244 and the pixel pad 242.

The contact pattern 260, as a bridge for contact of the pixel bar 244, may be expanded in length to a lower portion of the pixel bar 234. In this case, the contact pattern 260 may be formed using all transparent metals of the common electrode.

In addition to the unit FPC pad/unit FPC shorting connection part 240, the unit on-off pad part 230 and the bump input dummy/bump output dummy part 250 may also connect the pad 242 and the pixel bar 244 by using the above-described bridge layer 280.

The sizes of the second contact hole 185 and pad 242 in the second passivation layer 185 formed in the pad area may be changed, in which case the sizes are required to be sizes in which a test is capable of being performed with a probe tip.

In the LCD device and the method of manufacturing the same according to the second embodiment of the present invention, the second passivation layer 180 and the pixel electrode 190 are simultaneously formed by the single mask process using the half tone mask, and thus, manufacturing efficiency increases.

Moreover, in forming the pixel electrode 190, the present invention can prevent disconnection of the pixel bar 244, caused by loss of the pixel electrode 190 due to the lift-off process, in the pad area. Accordingly, the present invention can enhance the contact performance of the pixel bar 244 in the pad area.

FIG. 25 is a view illustrating a plurality of masks that are used in a schematic manufacturing method and process of an LCD device with integrated touch sensor.

Referring to FIG. 25, in the related art, a total of eleven masks are required in manufacturing a TFT array substrate with built-in touch sensor, but the number of masks can decrease by one or two in the manufacturing methods according to the first and second embodiments of the present invention.

Specifically, as illustrated in FIG. 25A, by forming the second passivation layer (PAS2) and a pixel electrode (PXL) with one half tone mask, the number of used masks can decrease by one compared to the related art. Accordingly, a TFT array substrate with built-in touch sensor can be manufactured with a total of ten masks.

Moreover, as illustrated in FIG. 25B, by forming the second passivation layer (PAS2) and a pixel electrode (PXL) with one half tone mask and forming a common electrode and a touch sensing line with one mask, the number of used masks can decrease by two compared to the related art.

Accordingly, a TFT array substrate with built-in touch sensor can be manufactured with a total of nine masks.

Accordingly, in manufacturing a TFT array substrate with built-in touch sensor, the number of masks can decrease, the manufacturing cost can be saved, and a time taken in manufacturing can be shortened.

As described above, the method of manufacturing the LCD device simultaneously forms the passivation layer and the pixel electrode in the single mask process using the half tone mask, and thus can increase manufacturing efficiency.

The method of manufacturing the LCD device can prevent disconnection, caused by loss of a pixel electrode due to the lift-off process, in the pad area.

In the LCD device and the method of manufacturing the same, the contact performance of the pixel bar can be enhanced in the pad area.

In addition to the aforesaid features and effects of the present invention, other features and effects of the present invention can be newly construed from the embodiments of the present invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing a liquid crystal display (LCD) device including a pad area with a pixel pad formed therein and a contact area with a pixel bar formed therein, the method comprising:
    forming a first passivation layer in the pad area and the contact area, and removing a portion of the first passivation layer to form a first contact hole;
    forming a lower metal inside the first contact hole and on the first passivation layer in the contact area;
    forming a second passivation layer to cover the first passivation layer and the lower metal;
    removing a portion of the second passivation layer overlapping the pixel bar in the contact area to form a second contact hole and removing another portion of the second passivation layer overlapping the lower metal in the first contact hole to form a third contact hole; and
    coating a transparent conductive material on the pad area to form a pixel electrode, and coating a transparent conductive material on the contact area to form a contact pattern,
    wherein the pixel pad and the pixel bar are connected with the contact pattern and the lower metal.

2. The method of claim 1, wherein the first and second contact holes are formed using a clear area of a half tone mask.

3. The method of claim 1, wherein,
    when forming a touch sensing line in an active area, the lower metal is formed of the same material as the touch sensing line, or
    when forming a common electrode in the active area, the lower metal is formed of the same material as the common electrode.

4. The method of claim 1, wherein the second contact hole is formed to have a size in which a test is capable of being performed with a probe tip.

5. The method of claim 1, wherein the lower metal acts as an etch stop in etching the second passivation layer.

6. The method of claim 1, wherein the forming of a second contact hole comprises:
    coating a photoresist on the second passivation layer, and forming a normal area, a half tone area, and a clear area by performing an etching process and a photolithography process using a half tone mask; and
    removing the second passivation layer through the clear area to form the second contact hole.

7. The method of claim 1, wherein,
    when forming a common electrode in an active area, the contact pattern is formed of the same material as the common electrode, and
    when forming a touch sensing line in the active area, the lower metal is formed of the same material as the touch sensing line.

8. The method of claim 1, wherein the lower metal extends to the first contact hole to connect the pixel bar to the pixel pad.

9. The method of claim 1, wherein the pixel electrode is connected to the lower metal via the third contact hole.

10. The method of claim 1, wherein the contact pattern extends to the pad area and contacts the lower metal via the third contact hole.

11. The method of claim 1, wherein the pixel electrode contacts the lower metal via the second contact hole.

12. The method of claim 1, wherein the contact pattern extends to the first contact hole, and
    wherein the lower metal is formed on the contact pattern in the contact area.

13. The method of claim 12, wherein the pixel electrode contacts the lower metal via the second contact hole.

14. The method of claim 1, wherein the second passivation layer has at least one other contact hole in the pixel bar in addition to the second contact hole to further expose the lower metal.

15. The method of claim 1, wherein the first contact hole has a larger area than the lower metal in the first contact hole in plan view, and
    wherein the lower metal has a larger area than the third contact hole in plan view.

* * * * *